United States Patent
Park et al.

(10) Patent No.: US 10,617,017 B2
(45) Date of Patent: Apr. 7, 2020

(54) ROLLABLE DISPLAY

(71) Applicant: LG Display Co., Ltd., Seoul (KR)

(72) Inventors: Jungkyu Park, Paju-si (KR);
Chounsung Kang, Goyang-si (KR);
Geunchang Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 147 days.

(21) Appl. No.: 15/375,022

(22) Filed: Dec. 9, 2016

(65) Prior Publication Data
US 2017/0367198 A1    Dec. 21, 2017

(30) Foreign Application Priority Data

Jun. 20, 2016  (KR) .......................... 10-2016-0076583

(51) Int. Cl.
| | | |
|---|---|---|
| H05K 5/00 | (2006.01) | |
| G06F 1/16 | (2006.01) | |
| H04M 1/02 | (2006.01) | |
| G09F 9/30 | (2006.01) | |
| H01L 51/52 | (2006.01) | |
| H05K 5/02 | (2006.01) | |
| H05K 5/03 | (2006.01) | |

(52) U.S. Cl.
CPC .......... *H05K 5/0017* (2013.01); *G06F 1/1652* (2013.01); *G09F 9/301* (2013.01); *H01L 51/5237* (2013.01); *H04M 1/0268* (2013.01); *H05K 5/0217* (2013.01); *H05K 5/03* (2013.01); *H01L 2251/5338* (2013.01)

(58) Field of Classification Search
CPC .. H05K 5/0017; H05K 5/03; H05K 151/5237; H05K 2251/5338
See application file for complete search history.

(56) References Cited

U.S. PATENT DOCUMENTS

| | | |
|---|---|---|
| 7,196,692 B2 | 3/2007 | Mochizuki et al. |
| 8,493,726 B2 * | 7/2013 | Visser .................. G06F 1/1601 361/679.05 |
| 8,654,519 B2 | 2/2014 | Visser et al. |
| 9,047,055 B2 | 6/2015 | Song |
| 9,164,547 B1 | 10/2015 | Kwon et al. |
| 9,743,537 B2 | 8/2017 | Kim et al. |
| 9,746,701 B2 | 8/2017 | Sung et al. |

(Continued)

FOREIGN PATENT DOCUMENTS

| | | |
|---|---|---|
| CN | 1493950 A | 5/2004 |
| CN | 101689066 A | 3/2010 |

(Continued)

OTHER PUBLICATIONS

European Extended Search Report, European Application No. 16207579.0, dated Aug. 28, 2017, 9 pages.

(Continued)

*Primary Examiner* — Anthony J Frost
(74) *Attorney, Agent, or Firm* — Fenwick & West LLP

(57) ABSTRACT

A rollable display includes a flexible display panel that can be rolled up and down, a back cover that rolls up and down along with the flexible display panel, with one edge fixed to one edge of the flexible display panel, and a flexible magnet fixed to either the flexible display panel or the back cover and interposed between the flexible display panel and the back cover.

21 Claims, 27 Drawing Sheets

(56) References Cited

U.S. PATENT DOCUMENTS

| | | | |
|---|---|---|---|
| 9,870,029 B2 | 1/2018 | Kim et al. | |
| 2004/0061683 A1* | 4/2004 | Mochizuki | G06F 1/1601 |
| | | | 345/168 |
| 2004/0128880 A1* | 7/2004 | Abe | G09F 11/29 |
| | | | 40/514 |
| 2010/0246113 A1 | 9/2010 | Visser et al. | |
| 2011/0043976 A1 | 2/2011 | Visser et al. | |
| 2013/0010405 A1* | 1/2013 | Rothkopf | H04M 1/0216 |
| | | | 361/679.01 |
| 2013/0314762 A1 | 11/2013 | Kwack et al. | |
| 2014/0118910 A1 | 5/2014 | Sung et al. | |
| 2014/0196254 A1 | 7/2014 | Song | |
| 2016/0187929 A1 | 6/2016 | Kim et al. | |
| 2016/0205791 A1 | 7/2016 | Kim et al. | |
| 2017/0009419 A1 | 1/2017 | Reinert | |

FOREIGN PATENT DOCUMENTS

| | | |
|---|---|---|
| CN | 101952873 A | 1/2011 |
| CN | 103927940 A | 7/2014 |
| CN | 104756176 A | 7/2015 |
| CN | 105741683 A | 7/2016 |
| EP | 1912416 A2 | 4/2008 |
| EP | 2765479 A2 | 8/2014 |
| KR | 10-2016-0087457 A | 7/2016 |
| TW | M429929 | 5/2012 |
| TW | M494473 | 1/2015 |
| TW | 201541145 A | 11/2015 |
| TW | 201603631 A | 1/2016 |
| TW | 201622535 A | 6/2016 |

OTHER PUBLICATIONS

First Chinese Office Action, Chinese Patent Application No. 201611273055.5, dated Feb. 26, 2019, 20 pages.

Taiwan Office Action, Taiwan Application No. 105143679, dated Feb. 12, 2018, 15 pages.

Office Action, Intellectual Property India Patent Application No. 201614044878, dated Jul. 22, 2019, 6 pages.

\* cited by examiner

Inner

Outer

FIG. 8B    FIG. 8C

ROLLABLE DISPLAY

CROSS-REFERENCE TO RELATED APPLICATION

This application claims the priority benefit of Republic of Korea Patent Application No. 10-2016-0076583 filed on Jun. 20, 2016, which is incorporated by reference for all purposes as if fully set forth herein.

BACKGROUND

Field of the Invention

The present invention relates to a rollable display.

Discussion of the Related Art

With the development of information technology, the market for displays, which act as an intermediary between users and information, is growing. Thus, the use of display devices such as organic light-emitting displays (OLEDs), liquid crystal displays (LCDs), and plasma display panels (PDPs) is increasing.

Among them, the organic light-emitting diode displays are self-emissive, and hence may have lower power consumption and thinner profile than the liquid crystal displays, which require a backlight. Also, the organic light-emitting diode displays offer advantages like wide viewing angle and fast response time. The processing techniques for organic light-emitting diode displays have been developed to an extent that allows mass production of large screens, and the organic light-emitting diode displays are expanding the market share, competing with the liquid crystal displays.

Pixels of an organic light-emitting diode display comprise organic light-emitting diodes (hereinafter, "OLEDs"), which are self-emissive. The organic light-emitting diode display may be classified as a variety of displays, depending on the type of emissive material, the emission method, the emission structure, and the driving method. The organic light-emitting diode displays may be classified as fluorescent emission devices or phosphorescent emission devices depending on the emission method, or classified as top emission devices or bottom emission devices depending on the emission structure. Also, the organic light-emitting diode displays may be classified into Passive Matrix OLEDs (PMOLEDs) and Active Matrix OLEDs (AMOLEDs).

Flexible displays have recently become commercially available. A flexible display can reproduce input images on the screen of a display panel where plastic OLEDs are formed. The plastic OLEDs are formed on a bendable plastic substrate. The flexible displays can come in various designs and offer benefits in portability and durability. The flexible displays may be implemented in various ways such as a bendable display, a foldable display, a rollable display, etc. Such flexible displays can be used in TVs (televisions), car displays, and wearable devices, as well as mobile devices such as smartphones and tablet PCs, and are broadening their range of applications.

A rollable display's display panel can be rolled up or unrolled as needed. The display panel may be made relatively thin and have a low self-weight so that it can be easily rolled up or unrolled and provides better aesthetic appearance in terms of design. However, a thin and lightweight display panel provides low physical durability. Thus, the display panel may be easily damaged by an external force applied to it, and this lowers the product's reliability and stability. Accordingly, there is a need for a solution to this problem.

SUMMARY

Embodiments relate to rollable display panel including a flexible display panel rolled up or down, a back cover that rolls up or down along with the flexible display panel, and a flexible magnet fixed to either the flexible display panel or the back cover, and interposed between the flexible display panel and the back cover. The back cover has an edge fixed to an edge of the flexible display panel;

In one embodiment, the rollable display further includes an elastic member having one end connected to another edge of the flexible display panel opposite the edge to which the edge of back cover is fixed, and another end connected to another edge of the back cover. The elastic member elastically deforms for a length corresponding to a length deviation between the other edge of the flexible display panel and the other edge of the back cover when the flexible display panel and the back cover are rolled up or down.

In one embodiment, the rollable display further includes a weighting bar fixed to the other edge of the back cover. The other end of the elastic member is connected to the weighting bar.

In one embodiment, the rollable display further includes an auxiliary bar fixed to the other edge of the flexible display panel. One end of the elastic member is connected to the auxiliary bar.

In one embodiment, the rollable display further includes a panel roller, and an elastic structure. The panel roller is fixed to the edge of the flexible display panel and the edge of the back cover. The flexible display panel and the back cover roll up onto or rolling down from the panel roller. The elastic structure is connected to the other edge of the flexible display panel. The elastic structure includes a stationary base member fixed at a specified location, a slider slidably fastened to the stationary base member, and an elastic member that elastically deforms along the sliding direction of the slider, with one end connected to the stationary base member and another end connected to the slider. An end of the slider fixed to another edge of the flexible display panel opposite the edge to which the end of back cover is fixed. The slider is placed between the flexible display panel and the back cover. The second elastic member elastically deforms for a length corresponding to a length deviation between the other edge of the flexible display panel and the other edge of the back cover when the flexible display panel and the back cover are roll up or down.

In one embodiment, the rollable display further includes a support structure attached to and extending along a side edge of the back cover, and the support structure enclosing a front edge of the flexible display panel and a side of the flexible display panel, wherein the support structure comprises a plurality of segments arranged in a direction parallel to the direction in which the flexible display panel and the back cover are rolled up or down.

In one embodiment, the rollable display further includes a support structure attached to and extending along a side edge of the back cover. The support structure includes a front body placed opposite the back cover, with the flexible display panel placed between the front body and the back cover and a middle body placed between the front body and the back cover. The front body includes a superelastic nitinol alloy.

In one embodiment, the rollable display further includes an elastic member connecting the adjacent segments.

In one embodiment, the rollable display further includes a panel roller which the flexible display panel and the back cover roll up onto and roll down from, and a housing accommodating the panel roller and including a slot open to internal space and through which the flexible display panel and the back cover are rolled up or down. A cut surface that defines the slot and makes contact with the flexible display panel when the flexible display panel is rolls up or down has a predetermined curvature ratio.

In one embodiment, the rollable display further includes a panel roller which the flexible display panel and the back cover roll up onto and roll down from; and a housing. The housing accommodates the panel roller, and includes a slot that is open to internal space and through which the flexible display panel and the back cover are roll up or down. The housing includes a first portion and a second portion that are of different thicknesses. The first portion is adjacent to a cut surface defining the slot and makes contact with the flexible display panel. The cut surface is thicker than the second portion.

In one embodiment, the flexible magnet is divided into multiple pieces, and at least one of (i) a gap between adjacent flexible magnet pieces, (ii) magnetic strength of the flexible magnet pieces, and (iii) density of the flexible magnet pieces varies according to locations.

Embodiments also relate to a rollable display including a flexible display panel, a back cover covering a rear side of the flexible display panel, a flexible magnet, and a panel roller. The back cover is rolled or unrolled with the flexible display panel. The flexible magnet is between the flexible display panel and the back cover. The flexible magnet is fixed to the flexible display panel or the back cover and rolled or unrolled with the flexible display panel. The flexible magnet slides relative to the back cover or the flexible display panel as the flexible display panel is rolled or unrolled. The panel roller is secured to an end of the flexible display panel and an end of the back cover. The panel roller winds or unwinds the flexible display panel, the back cover and the flexible magnet by rotating.

In one embodiment, the rollable display further includes an elastic member coupled between the back cover and the flexible display panel to pull another end of the flexible display panel toward another end of the back cover as the flexible magnet is wound onto the panel roller or the flexible magnet is unwound from the panel roller.

In one embodiment, the rollable display further includes an auxiliary bar extending across the other end of the flexible display panel and more rigid than the flexible display panel. An end of the elastic member is connected to the auxiliary bar and another end of the elastic member coupled to the back cover.

In one embodiment, a weighting bar is fixed to the other edge of the back cover to pull the flexible display panel downwards.

In one embodiment, the rollable display further includes a base, a slider and an elastic member. The slider moves relative to the base and the slider is attached to another end of the flexible display panel. An elastic member is between the base and the slider to pull the flexible display panel away from the panel roller as the flexible display panel is wound or unwound from the panel roller.

In one embodiment, the base is fixed to a stationary body and the panel roller hangs down with the other end of the flexible display panel supported by the slider and the elastic member.

In one embodiment, the base includes at least one guide groove engaging with a guide boss of the slider to slidably move the slider relative to the base.

In one embodiment, the base further includes an insertion groove configured to receive the elastic member. The slider includes a protrusion that is received in the elastic member and inserted into the insertion groove.

In one embodiment, the rollable display device further includes a support structure attached along a side edge of the back cover. The support structure includes a front body spaced apart from the back cover. The side edge of the flexible display panel is accommodated in space between the front body and the back cover.

In one embodiment, the support structure includes a plurality of segments that are aligned so that center planes of the segments are placed in a common plane that is parallel to the flexible display panel.

In one embodiment, the panel roller is enclosed in a housing with a slot through which the flexible display panel, the flexible magnet and the back cover pass through.

In one embodiment, the slot is defined at least by a cut surface coming in touch with the flexible display panel or the back cover. The radial thickness of a portion of the housing forming the cut surface is greater than other portions of the housing.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments illustrated in the accompanying drawings, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. In describing various exemplary embodiments, descriptions of the same or like components will be given in the beginning but omitted in other exemplary embodiments.

Although terms including ordinal numbers such as "first" and "second" may be used to describe various components, the components are not limited by the terms. The terms are used only to distinguish one component from other components.

A display device according to the present invention may be implemented based on displays such as a liquid crystal display (LCD), a field emission display (FED), a plasma display panel (PDP), an organic light-emitting display (OLED), an electrophoresis display (EPD), a quantum dot display (QDD), etc. For ease of explanation, an example will be provided in which a rollable display comprises an organic light-emitting diode (hereinafter, "OLED").

Figure 1:
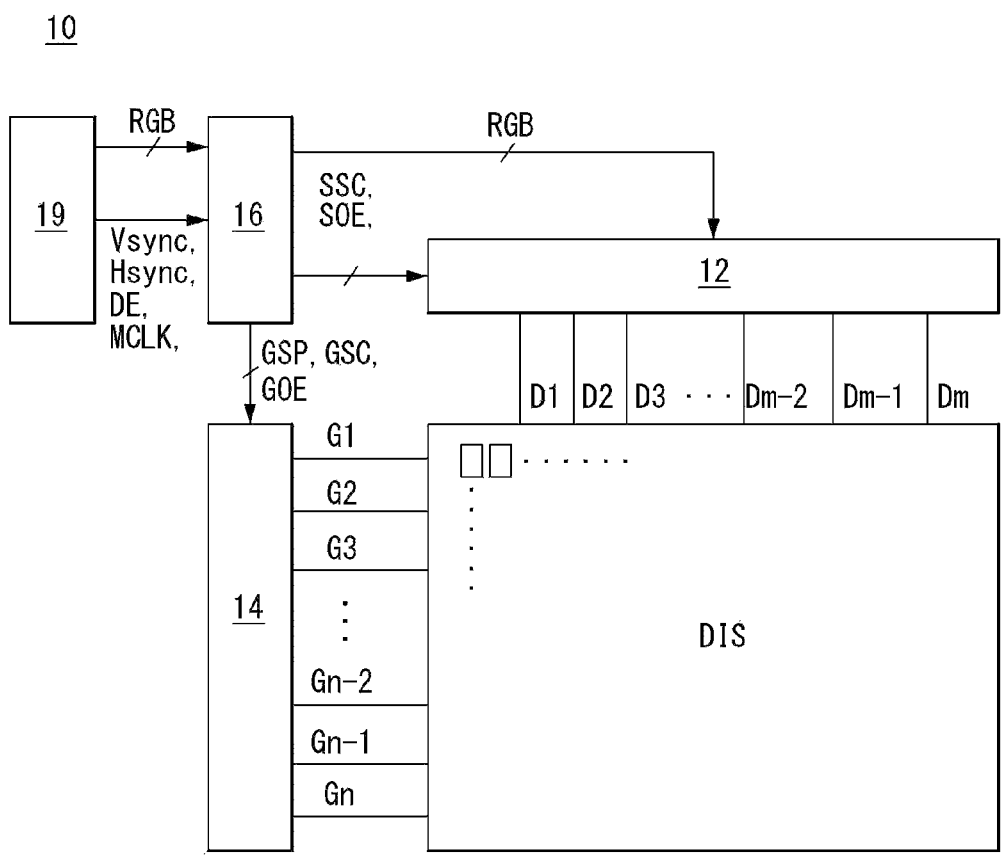
FIG. 1 is a view schematically showing a rollable display, according to an embodiment of the present invention.
Figure 2:
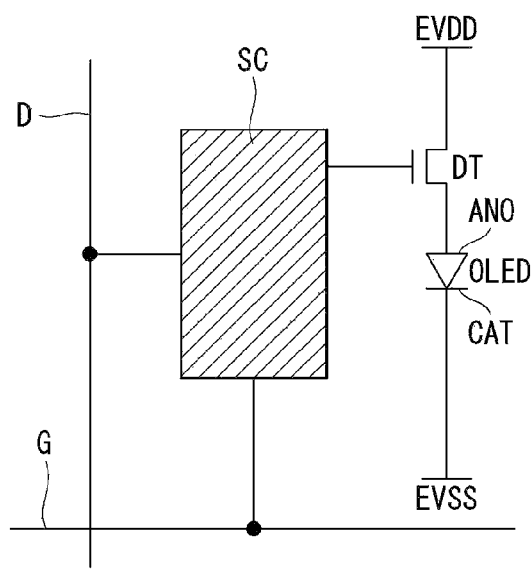
FIG. 2 is a view showing the configuration of a pixel in FIG. 1, according to one embodiment.
Figure 3:
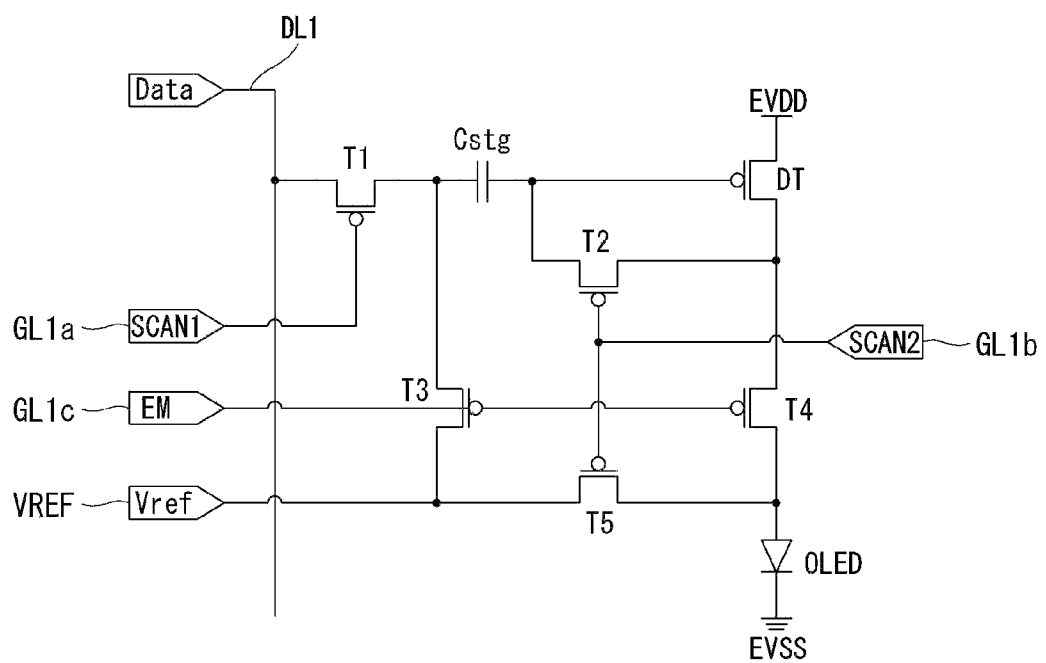
FIG. 3 is a circuit diagram showing the configuration of circuits in the pixel of FIG. 1, according to one embodiment.
Figure 4:
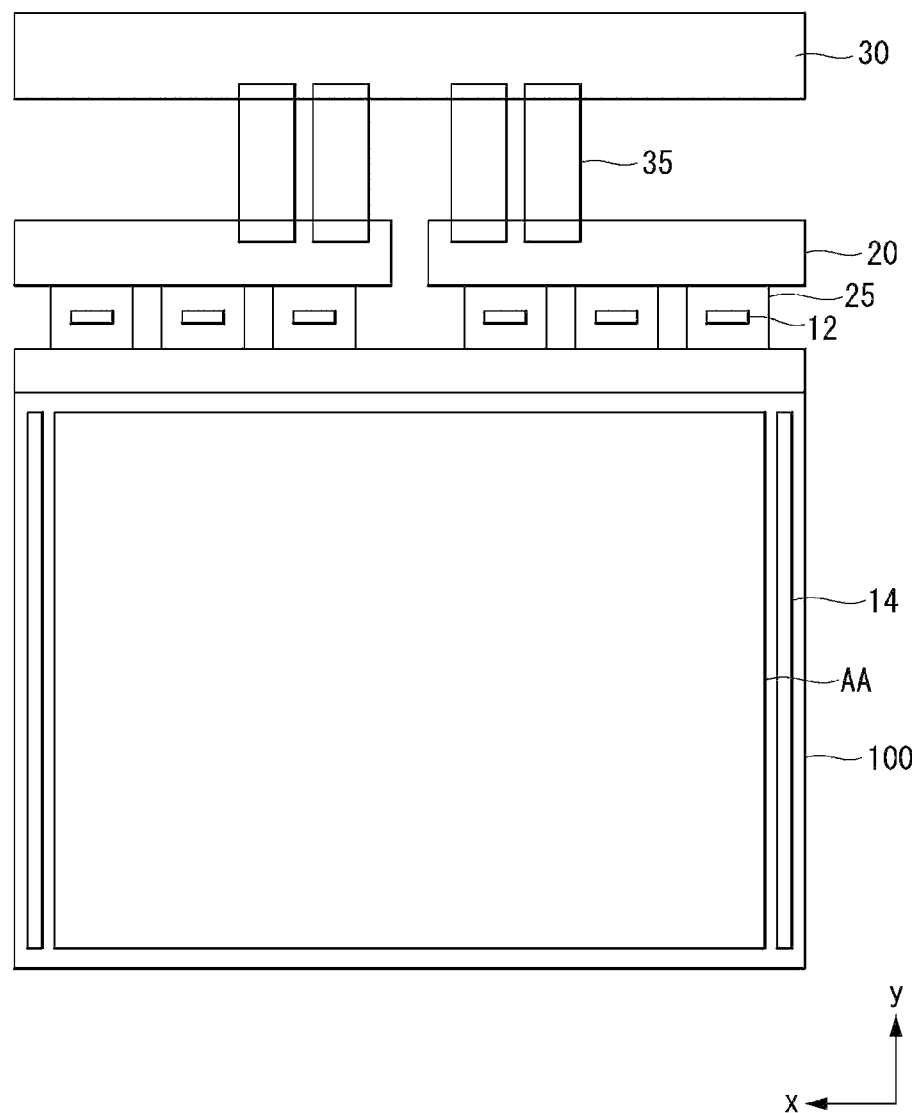
FIG. 4 is a view showing the structure of a flexible display panel implemented as a module, according to one embodiment.

FIG. 1 is a view schematically showing a rollable display according to an embodiment of the present invention. FIG. 2 is a view showing the configuration of a pixel of FIG. 1, according to one embodiment. FIG. 3 is a view showing an example of the configuration of circuits in the pixel of FIG. 1, according to one embodiment. FIG. 4 is a view showing the structure of a flexible display panel implemented as a module, according to one embodiment.

Referring to FIG. 1, a rollable display 10 according to one embodiment of the present invention comprises a display driver circuit and a flexible display panel 100. The display driver circuit comprises a data drive circuit 12, a gate drive circuit 14, and a timing controller 16, and writes an input image's video data voltage to pixels on the flexible display panel 100. The data drive circuit 12 converts digital video data RGB received from the timing controller 16 to an analog gamma compensating voltage and generates a data voltage. The data voltage output from the data drive circuit 12 is supplied to data lines Dl to Dm. The gate drive circuit 14 sequentially supplies a gate signal synchronized with the data voltage to gate lines Gl to Gm and selects pixels from the flexible display panel 100 to write the data voltage.

The timing controller 16 receives timing signals such as a vertical synchronization signal Vsync, a horizontal synchronization signal Hsync, a data enable signal DE, a main clock MCLK, etc. from a host system 19, and synchronizes the operation timings of the data drive circuit 12 and gate drive circuit 14. Data timing control signals for controlling the data drive circuit 12 comprise a source sampling clock SSC, a source output enable signal SOE, etc. Gate timing control signals for controlling the gate drive circuit 14 comprise a gate start pulse GSP, a gate shift clock GSC, a gate output enable signal GOE, etc.

The host system 19 may be implemented as any one of the following: a television system, a set-top box, a navigation system, a DVD player, a Blue-ray player, a personal computer PC, a home theater system, and a phone system. The host system 19 comprises a system-on-chip (SoC) with a scaler embedded in it, and converts digital video data RGB of an input image into a format suitable for display on the flexible display panel 100. The host system 19 transmits the timing signals Vsync, Hsync, DE, and MCLK, along with the digital video data, to the timing controller 16.

The pixel array on the flexible display panel 100 comprises pixels formed in pixel areas defined by data lines Dl to Dm (m is a positive integer) and gate lines Gl to Gn (n is a positive integer). Each pixel comprises an OLED, which is self-emissive.

Referring further to FIG. 2, a plurality of data lines D and a plurality of gate lines G intersect each other on the flexible display panel 100, and pixels are arranged in a matrix at the intersections of the data lines D and the gate lines G. Each pixel comprises a driving thin film transistor (hereinafter, TFT) DT for controlling the amount of current flowing through the OLED, and a programming part SC for setting the gate-source voltage of the driving TFT DT.

The programming part SC may comprise at least one switching TFT and at least one storage capacitor. The switching TFT turns on in response to a scan signal from a gate line G to thereby apply a data voltage from a data line D to one electrode of the storage capacitor. The driving TFT DT adjusts the amount of light emitted by the OLED by controlling the amount of current supplied to the OLED based on the amount of voltage stored in the storage capacitor. The amount of light emitted by the OLED is proportional to the current supplied from the driving TFT DT. Such a pixel is connected to a high voltage source EVDD and a low voltage source EVSS and takes high voltage and low voltage from a power generator (not shown). The TFTs of the pixel may be implemented as p-type or n-type. Also, a semiconductor layer for the TFTs of the pixel may comprise amorphous silicon, or polysilicon, or oxide. The OLED comprises an anode ANO, a cathode CAT, and an organic compound layer interposed between the anode ANO and the cathode CAT. The anode ANO is connected to the driving TFT DT.

Referring further to FIG. 3, a pixel may consist of 6 transistors and 1 capacitor (6T1C). However, the pixel configuration of the present invention is not limited to the 6T1C structure. That is, the present invention may use all types of OLED pixel structures that can adjust the current flowing through the OLED using the driving TFT.

The TFTs included in the pixels to be described below are P-type TFTs, for example, but not limited thereto and may be N-type TFTs. The positions of source and drain electrodes may vary depending on the type of the TFTs, so the source and drain electrodes may be called a first electrode and a second electrode in the following description.

A first TFT T1 comprises a gate electrode connected to a 1a-th gate line GL1a, a first electrode connected to a first data line DL1, and a second electrode connected to one end of a storage capacitor Cstg. The first TFT T1 serves to transmit a data signal supplied through the first data line DL1 to the storage capacitor Cstg, in response to a 1a-th gate signal SCAN1.

A second TFT T2 comprises a gate electrode connected to a 1b-th gate line GL1b, a first electrode connected to a gate electrode of a driving TFT DT, and a second electrode connected to a second electrode of the driving TFT DT. The second TFT T2 connects the gate electrode and source electrode node of the driving TFT DT in a diode connection, in response to a 1b-th gate signal SCAN2.

A third TFT T3 comprises a gate electrode connected to a 1c-th gate line GL1c, a first electrode connected to a reference voltage line VREF, and a second electrode connected to one end of the storage capacitor Cstg. The third TFT T3 serves to supply a reference voltage Vref (or compensating voltage) to one end of the storage capacitor Cstg, in response to a 1c-th gate signal EM.

A fourth TFT T4 comprises a gate electrode connected to the 1c-th gate line GL1c, a first electrode connected to the second electrode of the driving TFT DT, and a second electrode connected to the anode of the organic light-emitting diode OLED. The fourth TFT T4 serves to transmit driving current to the organic light-emitting diode OLED to make it emit light, in response to the 1b-th gate signal SCAN2.

A fifth TFT T5 comprises a gate electrode connected to the 1b-th gate line GL1b, a first electrode connected to the reference voltage line VREF, and a second electrode connected to the anode of the organic light-emitting diode OLED. The fifth TFT T5 serves to supply the reference voltage Vref to the anode of the organic light-emitting diode OLED, in response to the 1b-th gate signal SCAN2.

The driving TFT DT comprises a gate electrode connected to the other end of the storage capacitor Cstg, a first electrode connected to a first power supply (or high voltage source) EVDD, and a second electrode connected to the first electrode of the fourth TFT T4. The driving TFT DT turns on in response to a data voltage supplied from the storage capacitor Cstg and generates driving current to be supplied to the organic light-emitting diode OLED.

The organic light-emitting diode OLED comprises an anode connected to the second electrode of the fourth TFT T4 and a cathode connected to a second power supply (or low voltage source) EVSS. The organic light-emitting diode OLED emits light by the driving current transmitted through the fourth TFT T4.

Referring further to FIG. 4, the flexible display panel 100 is electrically connected and attached to the timing controller (16 of FIG. 1), the data drive circuit 12, the gate drive circuit 14, etc. and implemented as a module (the host system (19 of FIG. 1), the power generator, etc. are not shown).

The gate drive circuit 14 may be formed on the flexible display panel 100 by GIP technology. That is, the gate drive circuit 14 may be formed by GIP (Gate In Panel) technology on the left side, right side, or both the left and right sides of the display area AA so as to make it easy to roll the flexible display panel 100 up and down. However, the present invention is not limited to this.

A data printed circuit board (hereinafter, "data PCB") 20 is electrically connected to the flexible display panel 100 through a first connecting member 25. The first connecting member 25 may be, but not limited to, a COF (Chip On Film) with the data drive circuit 12 mounted on it. For example, the first connecting member 25 may be implemented by TCP (Tape Carrier Package) technology and electrically connect the data PCB 20 and the flexible display panel 100.

The data PCB 20 is connected to a control board 30 through a second connecting member 35. A plurality of second connecting members 35 may be provided. The timing controller 16, etc. is mounted on the control board 30. The second connecting member 35 may be, but not limited to, an FFC (Flexible Flat Cable). The control board 30 may be connected to the host system (19 of FIG. 1), the power generator, etc. by a connecting cable.

Figure 5A:
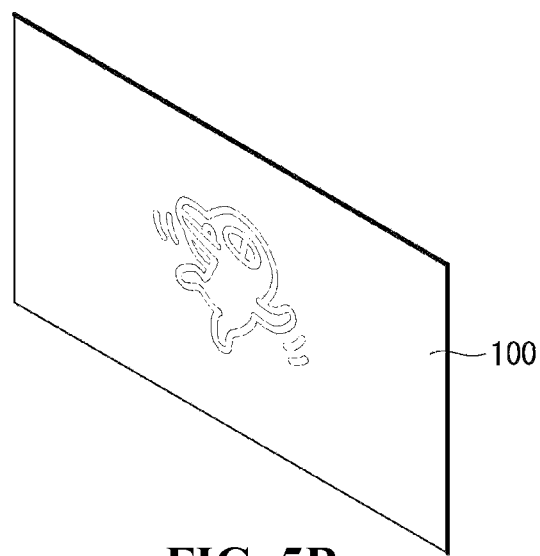
FIGS. 5A through 6C are views for explaining an example of using a rollable display according to an embodiment of the present invention.

FIGS. 5A through 6C are views for explaining an example of using a rollable display according to one embodiment of the present invention. Referring to FIG. 5A, a flexible display panel 100 implemented as a module (hereinafter, abbreviated as "flexible display panel") comprises a display area where an input image is displayed. The user may recognize information output from the flexible display panel 100 through the display area. The front side of the flexible display panel 100 is one side of the flexible display panel 100 where the display area is defined. By contrast, the rear side of the flexible display panel 100 is the side opposite to the front side of the flexible display panel, where the user cannot recognize the display area.

Figure 5B:
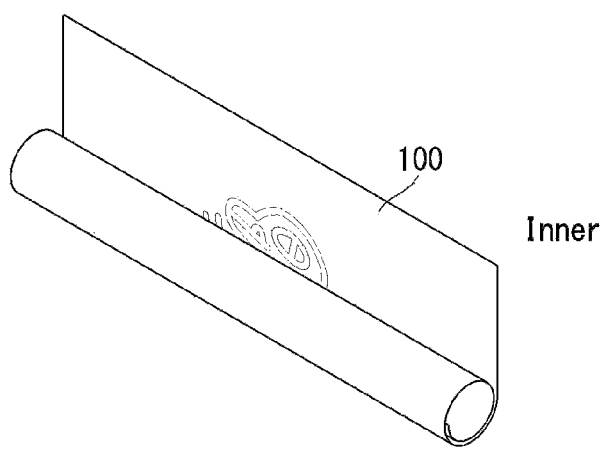
Figure 5B:
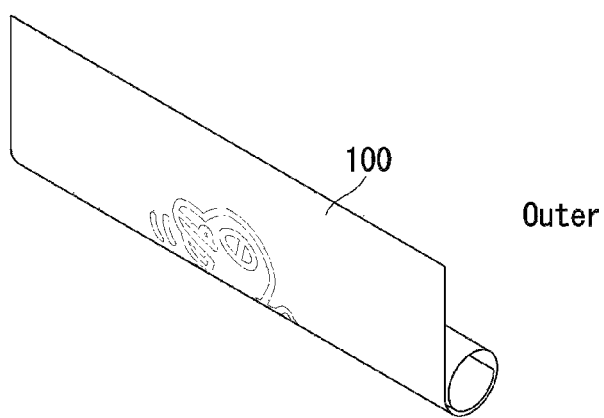

The flexible display panel 100 may be rolled up and down. That is, the flexible display panel 100 may be rolled and unrolled easily and repeatedly since it possesses some flexibility. The flexible display panel 100 may be rolled up in the front side direction of the flexible display panel 100 (hereinafter, "Inner rolling"), or rolled up in the rear side direction of the flexible display panel 100 (hereinafter, "outer rolling"), as illustrated in FIG. 5B. For ease of explanation, an example will be provided in which the flexible display panel is implemented in outer rolling manner unless specifically stated.

Figure 6A:
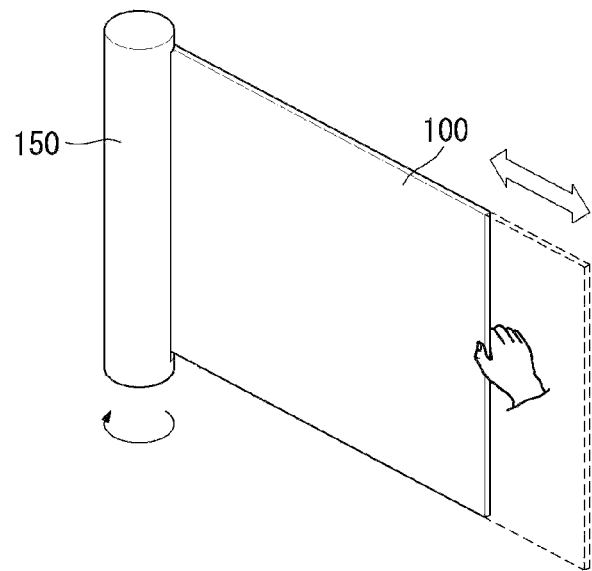

Referring to FIG. 6A, changes (roll-up and roll-down) in the state of the flexible display panel 100 may be caused by physical external forces provided directly by the user. For example, the user may grip one edge of the flexible display panel 100 to provide force to it and change the state of the flexible display panel 100.

Figure 6B:
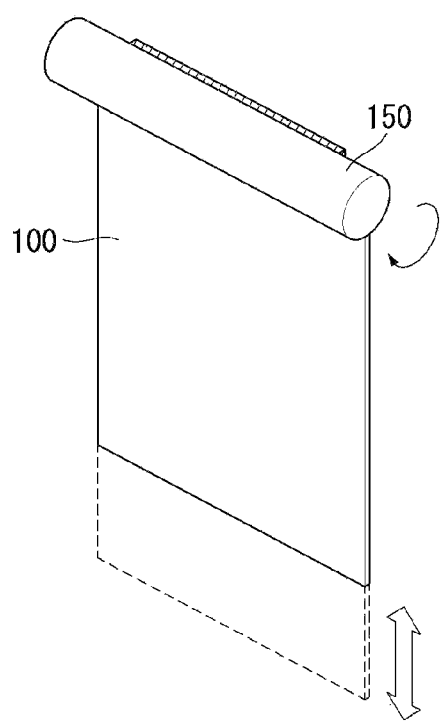
Figure 6C:
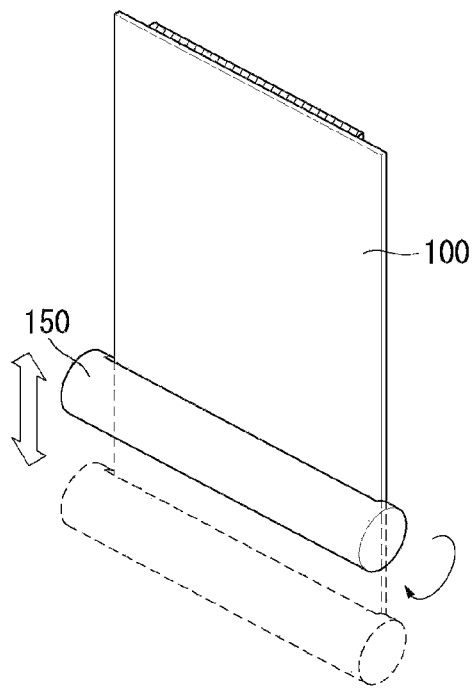

The changes in the state of the flexible display panel 100 may be controlled by a control part, in response to a predetermined signal as illustrated in FIGS. 6B and 6C. That is, the changes in the state of the flexible display panel 100 may be controlled by a selected driving device, driving circuit, etc.

The flexible display panel 100 may be rolled up around a tool such as a panel roller 150. The panel roller 150 may be approximately cylindrical. That is, a cross-section of the panel roller 150 may be circular. However, the panel roller 150 is not limited to this shape, but may take any shape as long as the flexible display panel 100 can be rolled up with ease. The panel roller 150 may be driven by a driving device such as a motor. The driving device may be a tubular motor, in which case the driving device may be provided within the panel roller 150. However, the present invention is not limited to this. The driving device may convert electrical energy to mechanical energy, in synchronization with a signal from the control part, and may provide the mechanical energy to the panel roller 150. The flexible display panel 100 may be rolled up and down in conjunction with the panel roller 150.

Although not shown, the flexible display panel 100 may be rolled up around a guide rail, in synchronization with the mechanical energy provided from the driving device. The guide rail may be spiral-shaped (or coil-shaped). The flexible display panel 100 is guided along the trajectory of the guide rail. The flexible display panel 100, when rolled up along the guide rail, is provided in such a way that there is a gap between its surfaces without surface-to-surface contact. Accordingly, it is possible to reduce any collision or interference that may occur between the surfaces of the flexible display panel 100 when rolled up.

The rollable display may be implemented in such a way that the flexible display panel 100 goes up and down while the panel roller 150 or guide roller is fixed, or that the panel roller 150 or guide roller goes up and down while one edge of the flexible display panel 100 is fixed.

Figure 7:
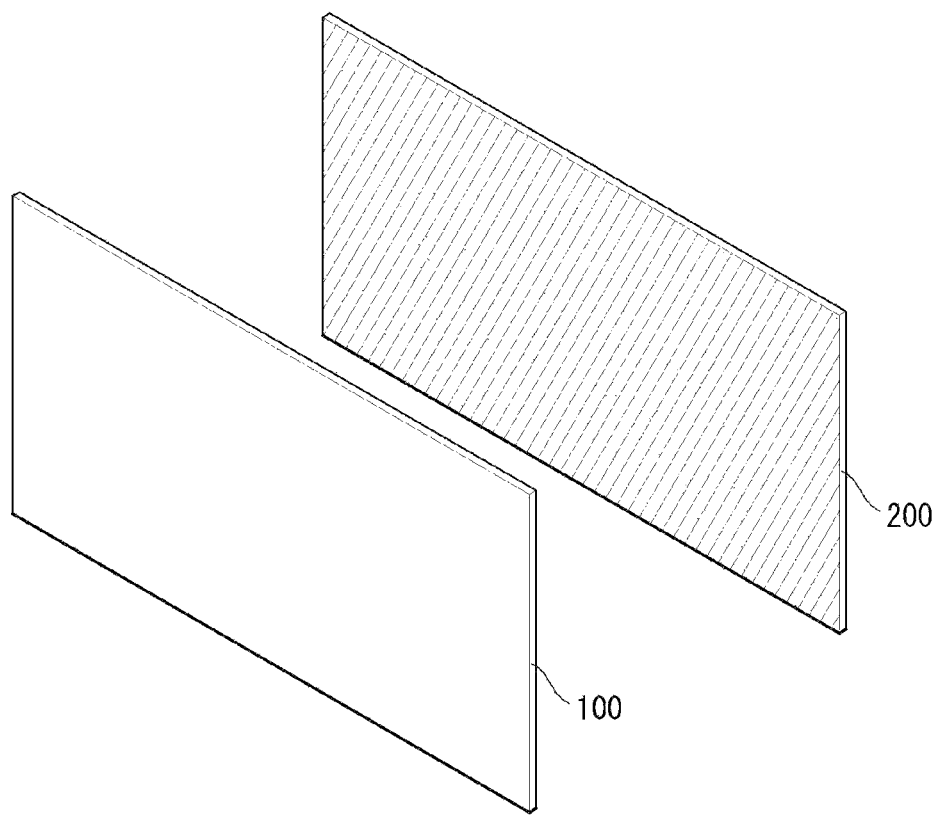
FIGS. 7 through 11 are views for explaining the structure of a rollable display according to an embodiment of the present invention.

FIGS. 7 through 11 are views for explaining the structure of a rollable display according to an embodiment of the present invention. Referring to FIG. 7, a rollable display according to the present invention comprises a flexible display panel 100 and a back cover 200 provided on the rear side of the flexible display panel 100.

The flexible display panel 100 may be rolled (i.e., wound) or unrolled (i.e., unwound) and maintain a first state or second state. The first state may refer to the rolled state of the flexible display panel 100. In the first state, the display area on the flexible display panel 100 is not exposed to the outside so that the user cannot recognize the display area from the outside. In the first state, the display device may be off so that no input image is displayed.

The second state may refer to the unrolled state of the flexible display panel 100. In the second state, the flexible display panel 100 may remain approximately flat. In the second state, the user may recognize the display area on the flexible display panel 100 and get necessary information. In the second state, the display device may be on so that an input image is displayed.

If required, the flexible display panel 100 may change from the first state to the second state or from the second state to the first state.

The back cover 200 supports the rear side of the flexible display panel 100, and reinforces the rigidity of the flexible display panel 100. By further comprising the back cover 200, the flexible display panel 100 may have higher physical durability. The back cover 200 may comprise a lightweight, high-strength material. For example, the back cover 200 may be made of any one of the following: GFRP (glass fiber reinforced plastic), CFRP (carbon fiber reinforced plastic), aluminum, and plastic.

One edge of the back cover 200 is fixed to one edge of the flexible display panel 100. That is, one edge of the back cover 200 and one edge of the flexible display panel 100 are held together where the back cover 200 and the flexible display panel 100 start to roll up. This means that one edge of the back cover 200 and one edge of the flexible display panel 100 are fixed so that their movement relative to each other may be restrained and restricted.

The back cover 200 may have a size and shape corresponding to the size and shape of the flexible display panel 100. The size and shape of the back cover 200 may be determined in a range that does not restrain and restrict free deformation of the flexible display panel 100.

Figure 8A:
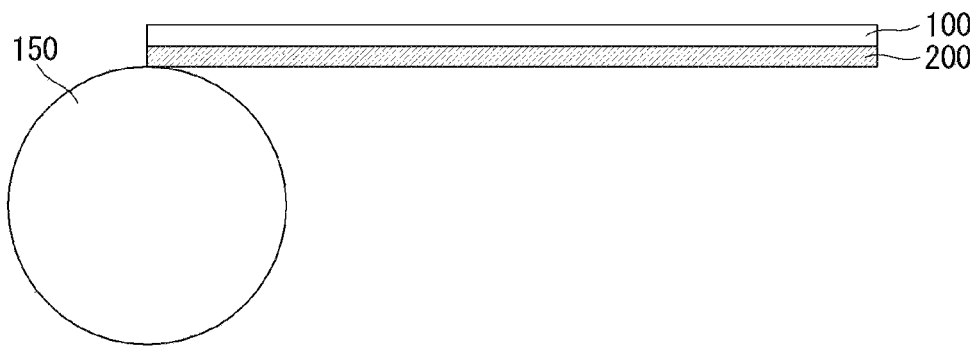
Figure 8A:
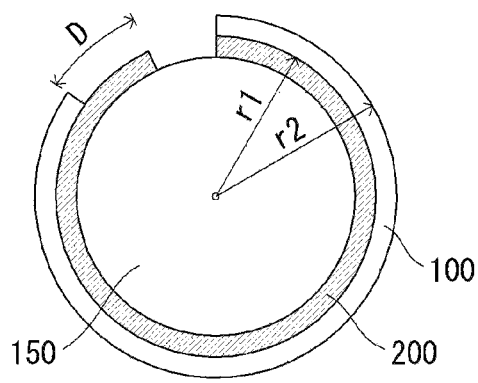
Figure 8A:
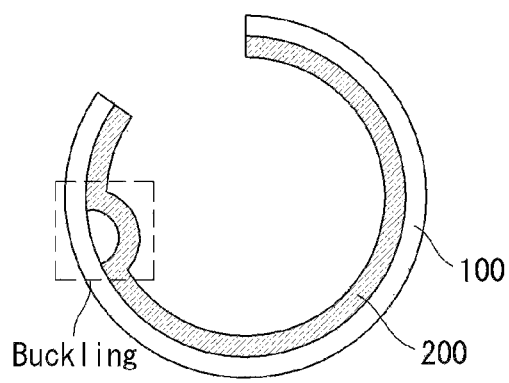

Referring to FIGS. 8A and 8B, when the flexible display panel 100 and the back cover 200 are rolled up around a central axis, a length deviation D occurs due to the difference in rolling radius r1 and r2 from the axis of rotation between the flexible display panel 100 and the back cover 200.

Referring to FIG. 8C, when the back cover 200 and flexible display panel 100, whose entire surfaces are held together with an adhesive, are rolled up, buckling, delamination, or cracking may occur due to the aforementioned length deviation. This may be even more problematic when it comes to making a rollable display with a compact design. That is, assuming that the flexible display panel 100 and the back cover 200 have a constant length, the smaller the rolling radius, the more the number of turns, and the more the number of turns, the greater the length deviation. Simply bonding the back cover 200 and the flexible display panel 100 together may be problematic since the possibility of buckling, delamination, cracking, etc increases as the length deviation becomes greater.

Figure 9:
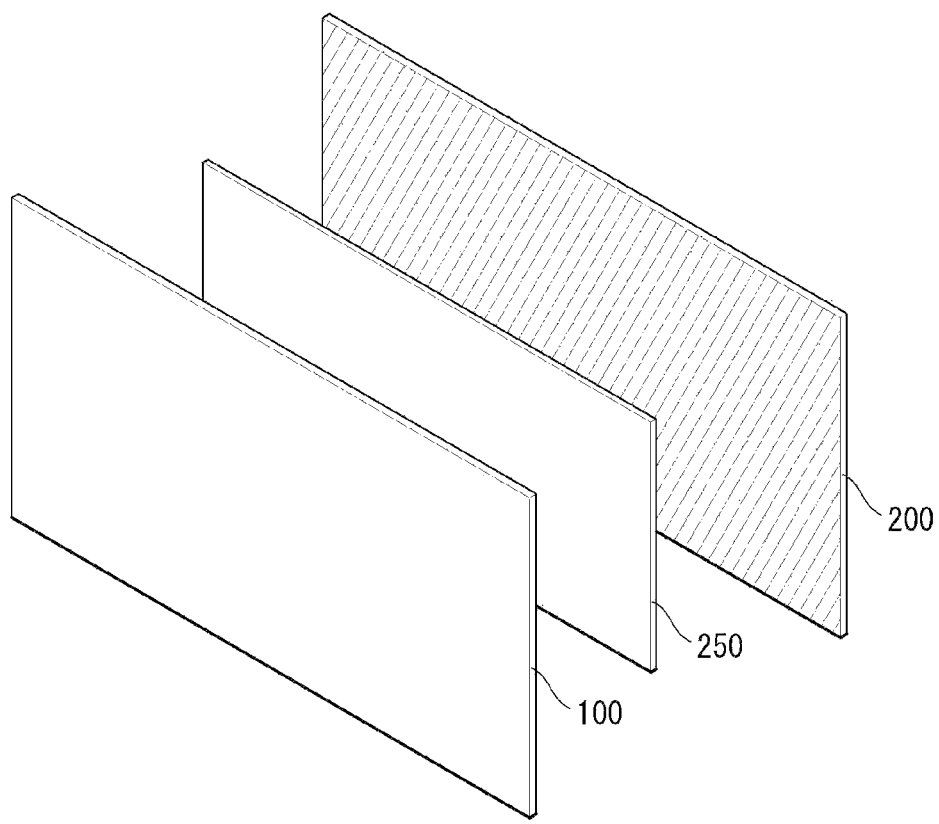

Referring to FIG. 9, to overcome the above-mentioned problem, the rollable display according to one embodiment of the present invention further comprises a flexible magnet 250 provided between the flexible display panel 100 and the back cover 200. The flexible magnet 250 may be rolled up or down when the flexible display panel 100 rolls up or down because it possesses some flexibility.

The flexible magnet 250 may be a rubber magnet. The rubber magnet has elasticity and flexibility, and is easy to manufacture. The flexible magnet 250 may have a size and shape corresponding to the size and shape of the flexible display panel 100 and/or back cover 200. The size and shape of the flexible magnet 250 may be determined in a range that does not restrain or restrict free deformation of the flexible display panel 100.

The flexible magnet 250 is fixed to either the flexible display panel 100 or the back cover 200. If the flexible magnet 250 is fixed to the back cover 200, the flexible magnet 250 makes sliding or slipping contact with the flexible display panel 100 by an attractive force between the flexible magnet 250 and the flexible display panel 100. For example, if the flexible display panel 100 comprises an OLED element, the flexible display panel 100 may further have an FSM (face seal material) layer for keeping moisture or oxygen from permeating into the OLED. The FSM layer may comprise invar. Invar is a nickel-iron alloy that has a low coefficient of thermal expansion. Thus, the flexible magnet 250 may make sliding contact with the flexible display panel 100 by an attractive force between the flexible magnet 250 and the FSM layer.

If the flexible magnet 250 is fixed to the flexible display panel 100, the flexible magnet 250 makes sliding contact with the back cover 200 by the attractive force between the flexible magnet 250 and the flexible display panel 100. In this case, the back cover 200 may be made of a metal, plastic magnet, etc. or made by attaching a metal, plastic magnet, etc. to a rigid member.

If the flexible display panel 100 has multiple layers, the location of the neutral plane is selected to prevent damage that may occur to a particular layer when the flexible display panel 100 is rolled up or down. By fixing the flexible magnet 250 to the flexible display panel 100, the location of the neutral plane may change relative to the flexible display panel 100 without the flexible magnet 250, thereby causing unwanted damage to a particular layer due to a change to the neutral plane of the flexible display panel 100. To prevent this, the flexible magnet 250 may be fixed to the back cover 200. In the following, for ease of explanation, an example will be provided in which the flexible magnet 250 is fixed to the back cover 200 and the flexible magnet 250 fixed to the back cover 200 makes sliding contact with the flexible display panel 100.

Figure 10A:
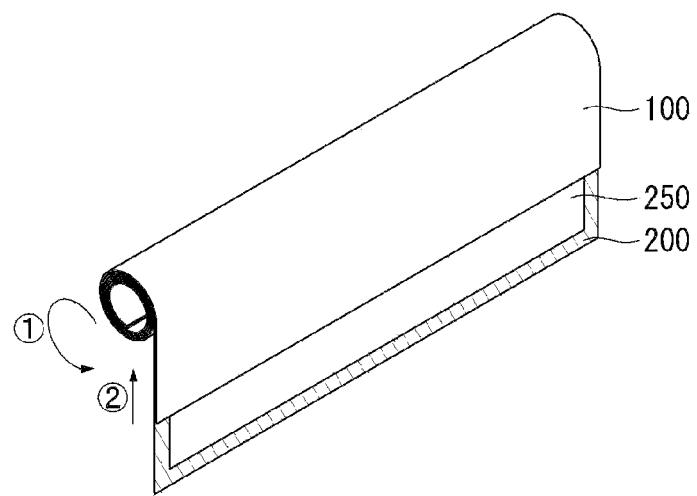
Figure 10B:
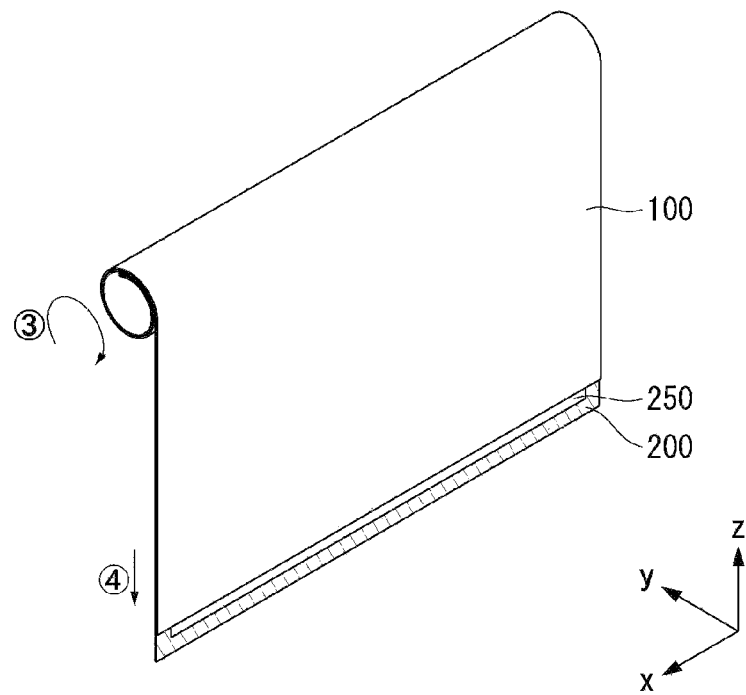

Referring further to FIGS. 10A and 10B, the relationship between the flexible display panel 100 and the back cover 200 moving relative to each other as the flexible display panel 100 rolls up and down is explained. Referring further to FIG. 10A, as the flexible display panel 100 is rolled up ①, it slides ② in a first direction along the surface of the back cover 200 with the flexible magnet 250 fixed to it. That is, since the flexible display panel 100 is rolled up, with one edge being fixed to one edge of the back cover 200, the length deviation between the flexible display panel 100 and the back cover 200 occurs. Corresponding to the increase in length deviation depending on the amount of rolling, the flexible display panel 100 slides in the first direction along the surface of the back cover 200 with the flexible magnet 250 fixed to it.

As shown in FIG. 10B, when the flexible display panel 100 is rolled down ③, it slides ④ in a second direction along the surface of the back cover 200 with the flexible magnet 250 fixed to it. That is, since the flexible display panel 100 is rolled down with one edge fixed to one edge of the back cover 200, the length deviation between the flexible display panel 100 and the back cover 200 gradually decreases. Corresponding to the decrease in length deviation, the flexible display panel 100 slides in the second direction along the surface of the back cover 200 with the flexible magnet 250 fixed to it.

By providing the flexible magnet 250, an exemplary embodiment of the present invention makes it possible to induce the flexible display panel 100 to slide on the back cover 200 when the flexible display panel 100 is rolled up or down, while restraining the flexible display panel 100 and the back cover 200 to prevent them from being separated from each other. That is, the length deviation between the flexible display panel 100 and the back cover 200 increases or decreases as the flexible display panel 100 rolls up or down, and the flexible display panel 100 slides along the surface of the back cover 200 with the flexible magnet 250 fixed to it, in order to compensate for the length deviation. Accordingly, in the exemplary embodiment of the present invention, defects such as buckling, delamination, cracking, etc. can be avoided by compensating for the length deviation caused when the flexible display panel 100 and the back cover 200 are rolled up or down.

As comparison, an implementation may use individual rollers for actuating the flexible display panel 100 and the back cover 200 to compensate for the length deviation between the flexible display panel 100 and the back cover 200. However, in such implementation, there would be considerable difficulty in synchronizing the rollers with one another, and the use of multiple rollers makes it difficult to make a display device with a compact design. By contrast, in the exemplary embodiment of the present invention, the length deviation between the flexible display panel 100 and the back cover 200 can be compensated simply by using the flexible magnet 250. Therefore, it is possible to provide a rollable display which ensures product reliability and stability and has a compact design.

Figure 11:
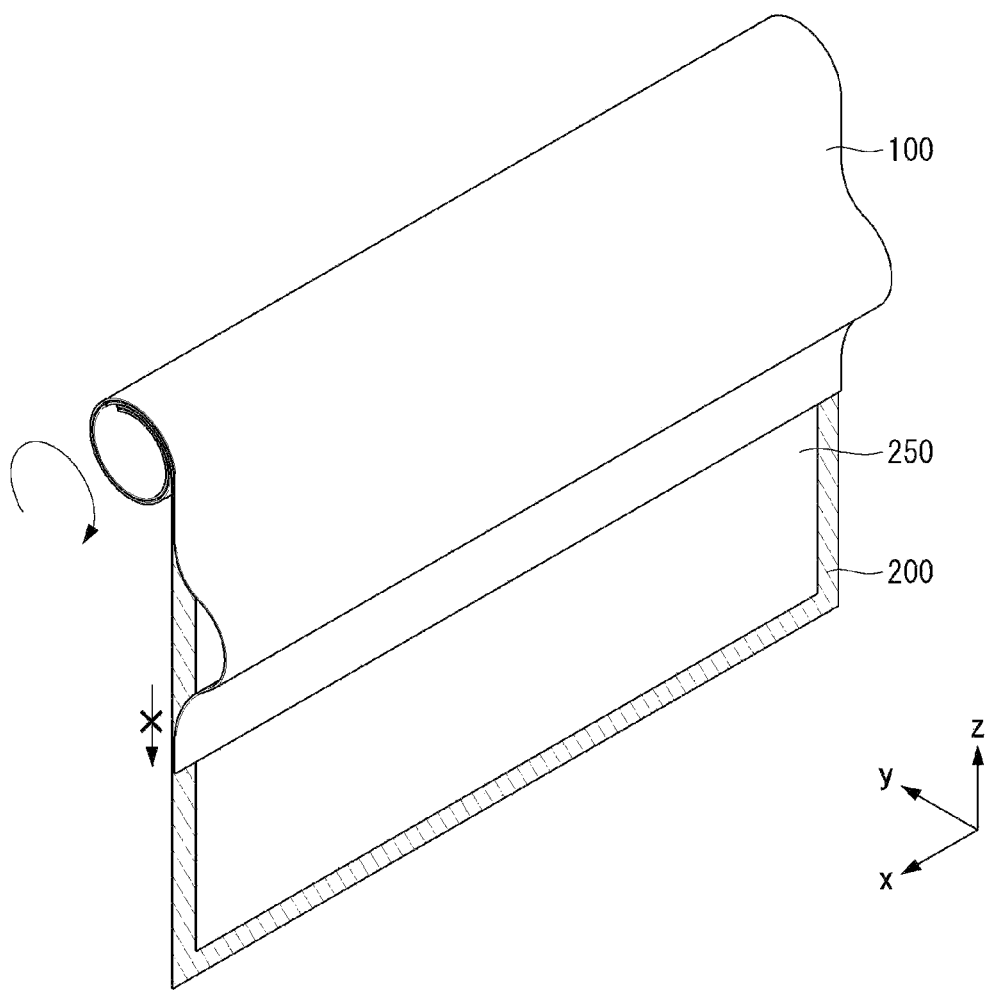

Referring to FIG. 11, the flexible display panel 100 slides on the flexible magnet 250 when the flexible display panel 100 rolls up and down. But, if the flexible magnet 250 has a strong magnetic force, the flexible display panel 100 having flexibility may not be able to slide along the surface of the flexible magnet 250, but rather be lifted locally off the flexible magnet 250. This becomes even more problematic in the case of large-area rollable displays. On the contrary, if the flexible magnet 250 has a weak magnetic force, the back cover 200 may be detached and separated from the flexible display panel 100, and hence, the back cover 200 cannot perform its original function of supporting the rear side of the flexible display panel 100 and reinforcing the rigidity of the flexible display panel 100. The magnetic force of the flexible magnet 250 is properly determined by taking the above-described problems into account. For example, the magnetic force of the flexible magnet 250 may be determined by taking the direction of magnetic lines, the gap between them, and the thickness of the flexible magnet 250. The magnetic force of the flexible magnet 250 may change gradually with the location.

The flexible display panel 100 may have a plurality of flexible magnets 250 that are separated from each other. The gap between adjacent flexible magnets 250 may vary with location. For example, the gap between adjacent flexible magnets 250 may be narrower in an area that requires strong magnetic force than in an area that does not require strong magnetic force. The magnetic force of each flexible magnet 250 may vary with location. That is, flexible magnets 250 may have stronger magnetic force in the area that requires strong magnetic force than in the area that does not require strong magnetic force. For example, equipotential rubber magnets may be provided in the area that does not require strong magnetic force, whereas anisotropic rubber magnets may be provided in the area that requires strong magnetic force. Alternatively or in addition, the density of the flexible magnets 250 may vary with location. For example, the density of the flexible magnets 250 may be higher in the area that requires strong magnetic force than in the area that does not require strong magnetic force.

Hereinafter, a description will be given of exemplary embodiments for preventing defects such as local lifting of the flexible display panel 100 off the flexible magnet 250 and detaching and separating of the flexible display panel 100 from the flexible magnet 250.

<First Exemplary Embodiment>

Figure 12:
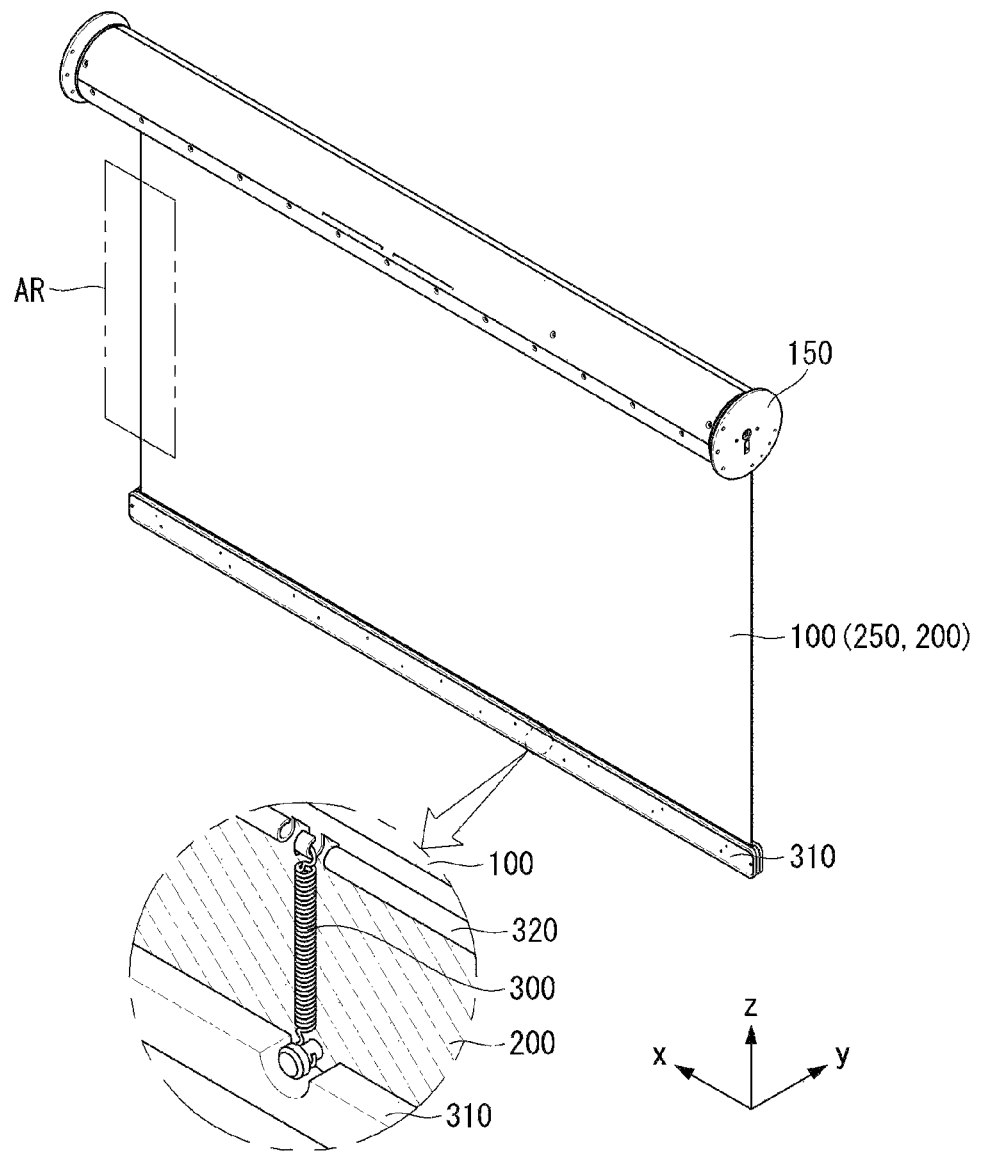
FIG. 12 is a perspective view illustrating a rollable display according to a first exemplary embodiment of the present invention.

A rollable display according to a first exemplary embodiment of the present invention is described with reference to FIGS. 12 through 13C. FIG. 12 is a perspective view illustrating a rollable display according to the first exemplary embodiment of the present invention. FIGS. 13A through 13C are views for explaining the operating condition of the rollable display according to the first exemplary embodiment of the present invention.

Referring to FIG. 12, the rollable display according to the first exemplary embodiment of the present invention comprises a panel roller 150, a flexible display panel 100, a back cover 200, a flexible magnet 250, and a first elastic member 300.

The panel roller 150 may be approximately cylindrical. That is, a cross-section of the panel roller 150 may be circular. However, the panel roller 150 is not limited to this shape and may take any shape as long as the flexible display panel 100 can be rolled up with ease.

The panel roller 150 may have internal space for accommodating the control board 30. The internal space may further have a stationary structure for fixing the control board 30. The stationary structure may be provided on the inside of the panel roller 150 and fix the control board 30 to prevent the control board 30 from falling out and colliding with other structures. This means that the movement of the control board 30 may be restrained and restricted within the panel roller 150. Embedding the control board 30 in the panel roller 150 offers the advantages of improving space utilization and giving the user aesthetic pleasure since the control board 30 is not visible from the outside.

However, the present invention is not limited to this, and the control board 30 may be provided on the outside of the panel roller 150. In this case, the control board 30 may be provided on the side opposite to where the flexible display panel 100 is fixed to the panel roller 150. Providing the control board 30 on the outside of the panel roller 150 offers the advantage of providing a rollable display with a compact design since the panel roller 150 can be made thinner.

A driving part for operating the panel roller 150 may be provided in the internal space of the panel roller 150. The driving part may be, but not limited to, a tubular motor. The driving part may be connected to a power generator such as an external power source or an internal battery to receive power. The panel roller 150 may receive torque from the driving part and perform rotation. The flexible display panel 100 and the back cover 200 may be rolled up onto or rolled down from the panel roller 150, in conjunction with the rotation of the panel roller 150.

The flexible display panel 100 comprises a display area where an input image is displayed. The display area may be defined in at least some part of the flexible display panel 100. The display panel comprises a plurality of pixels. The figures illustrate an example in which the planar shape of the flexible display panel 100 is approximately rectangular, but the present invention is not limited to this example. The planar shape of the flexible display panel 100 may be irregular (or free-form shape) such as circular.

The flexible display panel 100 rolls up onto or rolls down from the panel roller 150. The back cover 200 is provided on the rear side of the flexible display panel 100 and supports the flexible display panel 100. The back cover 200 rolls up onto or rolls down from the panel roller 150, along with the flexible display panel 100.

One edge of the back cover 200 and one edge of the flexible display panel 100 are held together where the flexible display panel 100 and the back cover 200 start to roll up. This means that one edge of the back cover 200 and one edge of the flexible display panel 100 are fixed so that their movement relative to each other may be restrained and restricted.

One edge of the back cover 200 and one edge of the flexible display panel 100 are held together and fixed to the panel roller 150. A portion of the panel roller 150 to which one edge of the back cover 200 and one edge of the flexible display panel 100 are fixed is where the flexible display panel 100 and the back cover 200 start to roll up. To this end, a bonding member or fixing member may be further provided between one edge of the back cover 200 or one edge of the flexible display panel 100 and the panel roller 150 to fix them.

The flexible magnet 250 is fixed to one side of the back cover 200 opposite the flexible display panel 100. The flexible magnet 250 is provided between the flexible display panel 100 and the back cover 200 to induce a sliding motion, corresponding to a length deviation caused when the flexible display panel 100 and the back cover 200 are roll up or down.

When the flexible display panel 100 and the back cover 200 roll down from the panel roller 150, the flexible display panel 100 does not slide smoothly and the flexible display panel 100 may lift locally off the surface of the back cover 200, due to the magnetic force of the flexible magnet 250. To prevent this, the first exemplary embodiment of the present invention further comprises a first elastic member 300.

The first elastic member 300 may deform according to the length deviation between the other edge of the flexible display panel 100 and the other edge of the back cover 200. The length deviation refers to how far the position of the other edge of the flexible display panel 100 and the other edge of the back cover 200 according to change of state deviates from the position of the other edge of the flexible display panel 100 and the other edge of the back cover 200 in the second state.

In an example, the first elastic member 300 may be a tension spring. If the length deviation between the flexible display panel 100 and the back cover 200 increases, the tension spring may stretch along a length corresponding to the increase of the length deviation. If the length deviation between the flexible display panel 100 and the back cover 200 decreases, the tension spring may retract for a length corresponding to the decreased length deviation.

One edge of the first elastic member 300 is connected to the other edge of the back cover 200. In an example, a weighting bar 310 may be further provided on the other edge of the flexible display panel 100, and one end of the first elastic member 300 may be fixed to the weighting bar 310. The weighting bar 310 has a certain weight to it.

The weighting bar 310 may have a shape that makes it easy to grip. That is, the weighting bar 310 may function as a tool for the user to grip. By providing the weighting bar 310, the embodiment of FIG. 12 provides a gripping area that allows for easy rolling. Assuming that the flexible display panel 100 rolls down with the panel roller 150 fixed to it, the unrolled flexible display panel 100 may remain flat by the self-weight of the weighting bar 310. This means that, since the weighting bar 310 has a certain weight (or load) to it, a force pulling the unrolled flexible display panel 100 in the direction of gravitational force may be applied to the flexible display panel 100. By providing a weighting bar 310 of a certain weight on the other edge of the flexible display panel 100, the movement of the flexible display panel 100 is restrained and restricted unless other forces are applied to it.

The other end of the first elastic member 300 is connected to the other edge of the flexible display panel 100. In an example, an auxiliary bar 320 may be further provided on the other edge of the flexible display panel 100, and the other end of the first elastic member 300 may be fixed to the auxiliary bar 320. The auxiliary bar 320 has rigidity higher than the flexible display panel 100. If the first elastic member 300 is fixed directly to the other edge of the flexible display panel 100, a stress caused by the restoring force of the first elastic member 300 is applied to the flexible display panel 100, thereby causing damage. By providing the auxiliary bar 320, the first exemplary embodiment of the present invention offers the advantage of distributing and alleviating the stress applied to the flexible display panel 100, thereby minimizing damage to the flexible display panel 100.

Figures 13A, 13B, 13C:
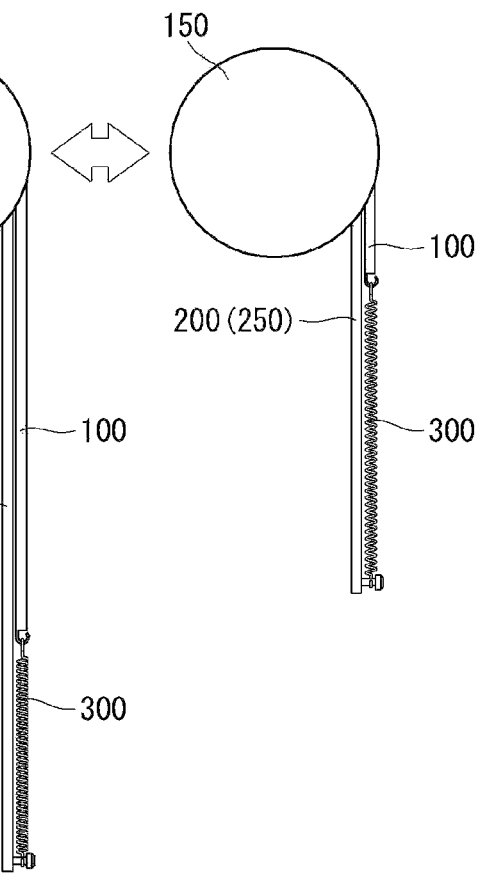
FIGS. 13A through 13C are views for explaining the operating condition of the rollable display according to the first exemplary embodiment of the present invention.

Referring further to FIGS. 13A through 13C, the first elastic member 300 elastically deforms within a certain range, in conjunction with the rolling up or down of the flexible display panel 100 and the back cover 200. When the flexible display panel 100 and the back cover 200 roll up onto the panel roller 150, the flexible display panel 100 slides in a first direction (e.g., +Z direction) along the surface of the back cover 200, with the flexible magnet 250 in between the flexible display panel 100 and the back cover 200. As the flexible display panel 100 and the back cover 200 roll up onto the panel roller 150, the length deviation between the other edge of the flexible display panel 100 and the other edge of the back cover 200 gradually increases. The first elastic member 300 gradually stretches, corresponding to the length deviation between the other edge of the flexible display panel 100 and the other edge of the back cover 200, as illustrated by FIG. 13A through 13C.

When the flexible display panel 100 and the back cover 200 roll down from the panel roller 150, the flexible display panel 100 slides in a second direction (e.g., −Z direction) along the surface of the back cover 200, with the flexible magnet 250 in between the flexible display panel 100 and the back cover 200. As the flexible display panel 100 and the back cover 200 rolls down from the panel roller 150, the length deviation between the other edge of the flexible display panel 100 and the other edge of the back cover 200 gradually decreases. The first elastic member 300 gradually regains its elasticity, corresponding to the length deviation between the other edge of the flexible display panel 100 and the other edge of the back cover 200 in the order of states as illustrated in FIG. 13C, FIG. 13B and FIG. 13A. This means that a force pulling the flexible display panel 100 may be applied to the flexible display panel 100 by the restoring force of the first elastic member 300.

By providing the first elastic member 300, the first exemplary embodiment of the present invention allows the flexible display panel 100 to slide smoothly when the flexible display panel 100 and the back cover 200 roll up and down. Accordingly, the first exemplary embodiment of the present invention can prevent the flexible display panel 100 from lifting locally off the flexible magnet 250.

<Second Exemplary Embodiment>

Figure 14:
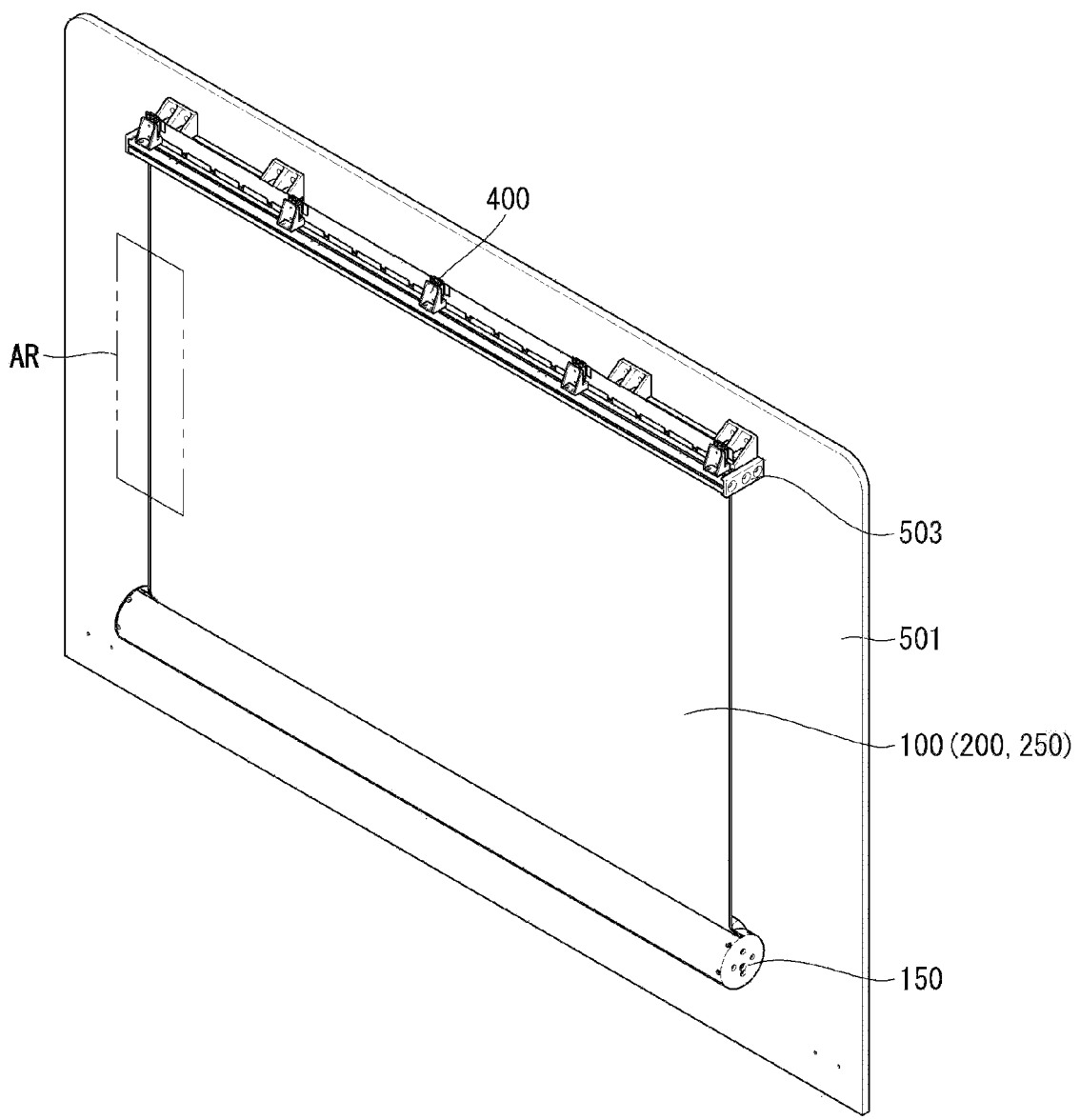
FIG. 14 is a perspective view illustrating a rollable display according to a second exemplary embodiment of the present invention.

A rollable display according to a second exemplary embodiment of the present invention is described below in reference to FIGS. 14 through 19. FIG. 14 is a perspective view illustrating a rollable display according to the second exemplary embodiment of the present invention. FIGS. 15A through 15D are views for explaining the configuration and operation of an elastic structure, according to one embodiment. FIGS. 16 through 19 are views for explaining the operating condition of the rollable display according to the second exemplary embodiment of the present invention.

Referring to FIG. 14, the rollable display according to the second exemplary embodiment of the present invention comprises a panel roller 150, a flexible display panel 100, a back cover 200, a flexible magnet 250, and an elastic structure 400.

The panel roller 150 may be approximately cylindrical. That is, a cross-section of the panel roller 150 may be circular. However, the panel roller 150 is not limited to this shape, but may take any shape as long as the flexible display panel 100 can be rolled with ease.

The panel roller 150 may have internal space for accommodating the control board 30. The internal space may further have a stationary structure for fixing the control board 30. The stationary structure may be provided on the inside of the panel roller 150 and fix the control board 30 to prevent the control board 30 from falling out and colliding with other structures. This means that the movement of the control board 30 may be restrained and restricted within the panel roller 150. However, the present invention is not limited to this, and, as shown in the figure, the control board 30 may be provided on the outside of the panel roller 150. In this case, the control board 30 may be provided on the side opposite where the flexible display panel 100 is fixed to the panel roller 150.

A driving part for driving the panel roller 150 may be provided in the internal space of the panel roller 150. The driving part may be, but is not limited to, a tubular motor. The driving part may be connected to a power generator such as an external power source or an internal battery to receive power. The panel roller 150 may receive torque from the driving part and perform rotation. The flexible display panel 100 and the back cover 200 may be rolled up onto or rolled down from the panel roller 150, in conjunction with the rotation of the panel roller 150.

The flexible display panel 100 comprises a display area where an input image is displayed. The display area may be defined in at least some part of the flexible display panel 100. The display panel comprises a plurality of pixels. The figures illustrate an example in which the planar shape of the flexible display panel 100 is approximately rectangular, but the present invention is not limited to this example. The planar shape of the flexible display panel 100 may be irregular such as circular.

The flexible display panel 100 rolls up onto or rolls down from the panel roller 150. The back cover 200 is provided on the rear side of the flexible display panel 100 and supports the flexible display panel 100. The back cover 200 rolls up onto or rolls down from the panel roller 150, along with the flexible display panel 100.

One edge of the back cover 200 and one edge of the flexible display panel 100 are held together where the flexible display panel 100 and the back cover 200 start to roll up. This means that one edge of the back cover 200 and one edge of the flexible display panel 100 are fixed so that their movement relative to each other may be restrained and restricted.

One edge of the back cover 200 and one edge of the flexible display panel 100 are held together and are fixed to the panel roller 150. A portion of the panel roller 150 to which one edge of the back cover 200 and one edge of the flexible display panel 100 are fixed is where the flexible display panel 100 and the back cover 200 start to roll up. To this end, a bonding member or fixing member may be further provided between one edge of the back cover 200 or one edge of the flexible display panel 100 and the panel roller 150 to fix them.

The flexible magnet 250 is fixed to one side of the back cover 200 opposite the flexible display panel 100. The flexible magnet 250 is provided between the flexible display panel 100 and the back cover 200 to induce a sliding motion, corresponding to a length deviation caused when the flexible display panel 100 and the back cover 200 roll up or down.

When the flexible display panel 100 and the back cover 200 are rolled down from the panel roller 150, the magnetic force of the flexible magnet 250 may keep the flexible display panel 100 from sliding smoothly, and the flexible display panel 100 may lift locally off the surface of the back cover 200. To prevent this, the second exemplary embodiment of the present invention further comprises an elastic structure 400.

Figure 15A:
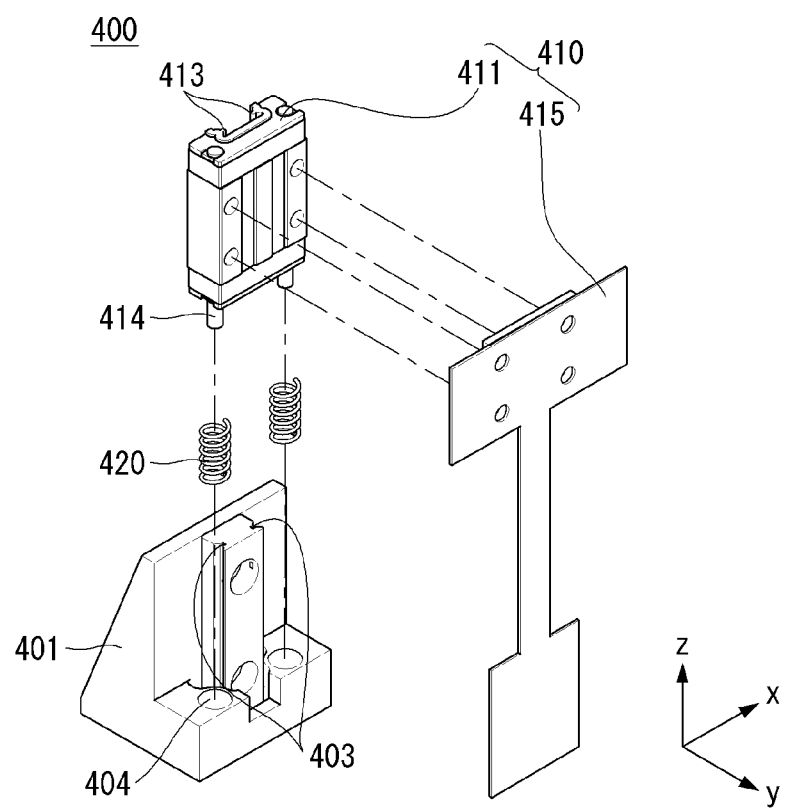
FIG. 15A through 15D are views for explaining the configuration and operation of an elastic structure, according to one embodiment.
Figure 15B:
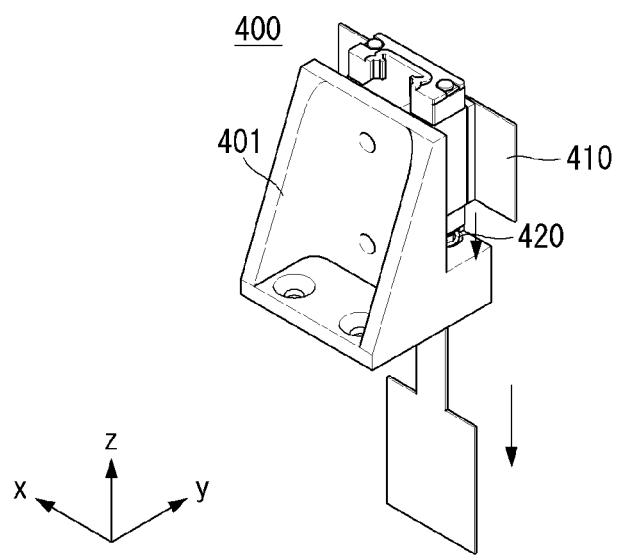
Figure 15C:
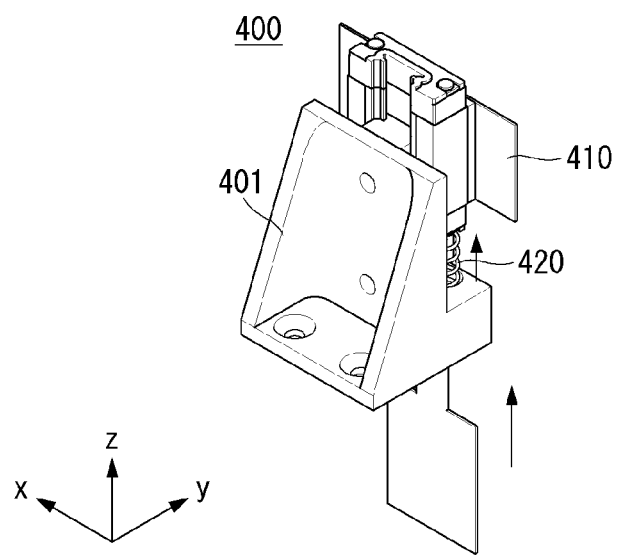

Referring to FIG. 15A, the elastic structure 400 comprises a stationary base member 401, a slider 410, and elastic members 420. One elastic structure may be used or a plurality of elastic structures 400 may be used in conjunction. The elastic structures 400 may be placed at a predetermined distance from one another. The number of elastic structures 400 and/or the distance between adjacent elastic structures 400 may be determined by taking the sizes and self-weights of the flexible display panel 100 and back cover 200 and the allowable load of the elastic member 420. The elastic structures 400 induce smooth sliding of the flexible display panel 100.

The stationary base member 401 may be fixed to a stationary body 501 at any specified location so that its movement is restrained. The stationary body 501 may be a wall, the ground, etc. For example, the stationary base member 401 may be fastened to a frame 503 fixed to a wall. The stationary base member 401 comprises guide grooves 403 to which the slider 410 is slidably fastened. The guide grooves 403 may extend in the Z-axis direction and guide the sliding motion (or sliding direction) of the slider 410.

The slider 410 comprises a guide part 411 and a fastening part 415. The guide part 411 and the fastening part 415 may be held together by fastening members such as screws (not shown).

The guide part 411 is fastened to the stationary base member 401 so as to be movable in the Z-axis direction. The guide part 411 comprises guide bosses 413 that are movably inserted into the guide grooves 403. The guide bosses 413 may be inserted into the guide grooves 403 and move in the direction in which the guide grooves 403 extend. This means that the movement of the slider 410 is restricted to the direction in which the guide grooves 403 extend. In the embodiment of FIGS. 15A through 15D, the guide grooves 403 extend vertically.

One end of the fastening part 415 is placed between the flexible display panel 100 and the back cover 200, and fixed to the flexible display panel 100. This means that the slider 410 and the flexible display panel 100 are connected together and move in conjunction with each other.

Figure 15D:
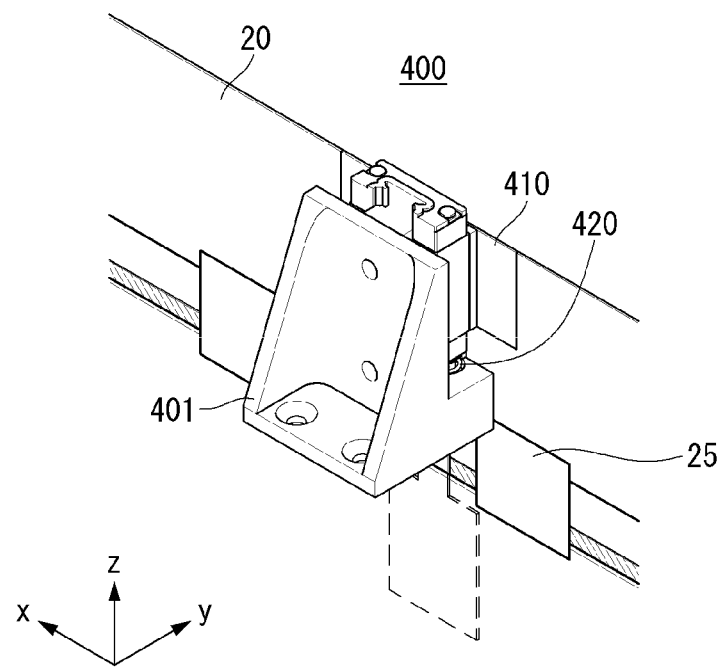

As illustrated in FIG. 15D, a data PCB 20 may be fixed to the other end of the fastening part 415. In this case, since the flexible display panel 100 fixed to one end of the fastening part 415 and the data PCB 20 fixed to the other end of the fastening part 415 move in conjunction with each other, it is possible to prevent damage to a first connecting member 25 that connects the flexible display panel 100 and the data PCB 20. The control board 30 to be connected to the data PCB 20 may be fixed to one side of the stationary body 501.

The elastic member 420 may elastically deform along the Z-axis direction. For example, the elastic member 420 may be fastened to protrusions 414 protruding from the guide part 411 in the Z-axis direction in such a way that makes it movable and deformable. The protrusions 414 may be fastened to insertion grooves 404 formed in the stationary base member 401 in such a way that they can be inserted into or taken out from the insertion grooves 404. The insertion grooves 404 are formed at locations corresponding to the protrusions 414 in a certain area of the stationary base member 401, and may have the shape of a recess formed in the Z-axis direction or the shape of a hole perforated in the Z-axis direction. Although not shown, a stopper may be further provided in a certain area of the protrusions 414 and/or insertion grooves 404, in order to keep the elastic member 420 from falling out from the protrusions 414. The stopper restricts the movement of the protrusions 414 so as to keep the protrusions 414 from completely falling out from the insertion grooves 404.

The elastic member 420 may be compressed if the slider 410 slides in the Z-axis direction by an external force applied to it. The elastic member 420 may regain its elasticity when the external force applied to the slider 410 is released. In this instance, the slider 410 slides in the +Z-axis direction by the elastic force received from the elastic member 420.

Figure 16:
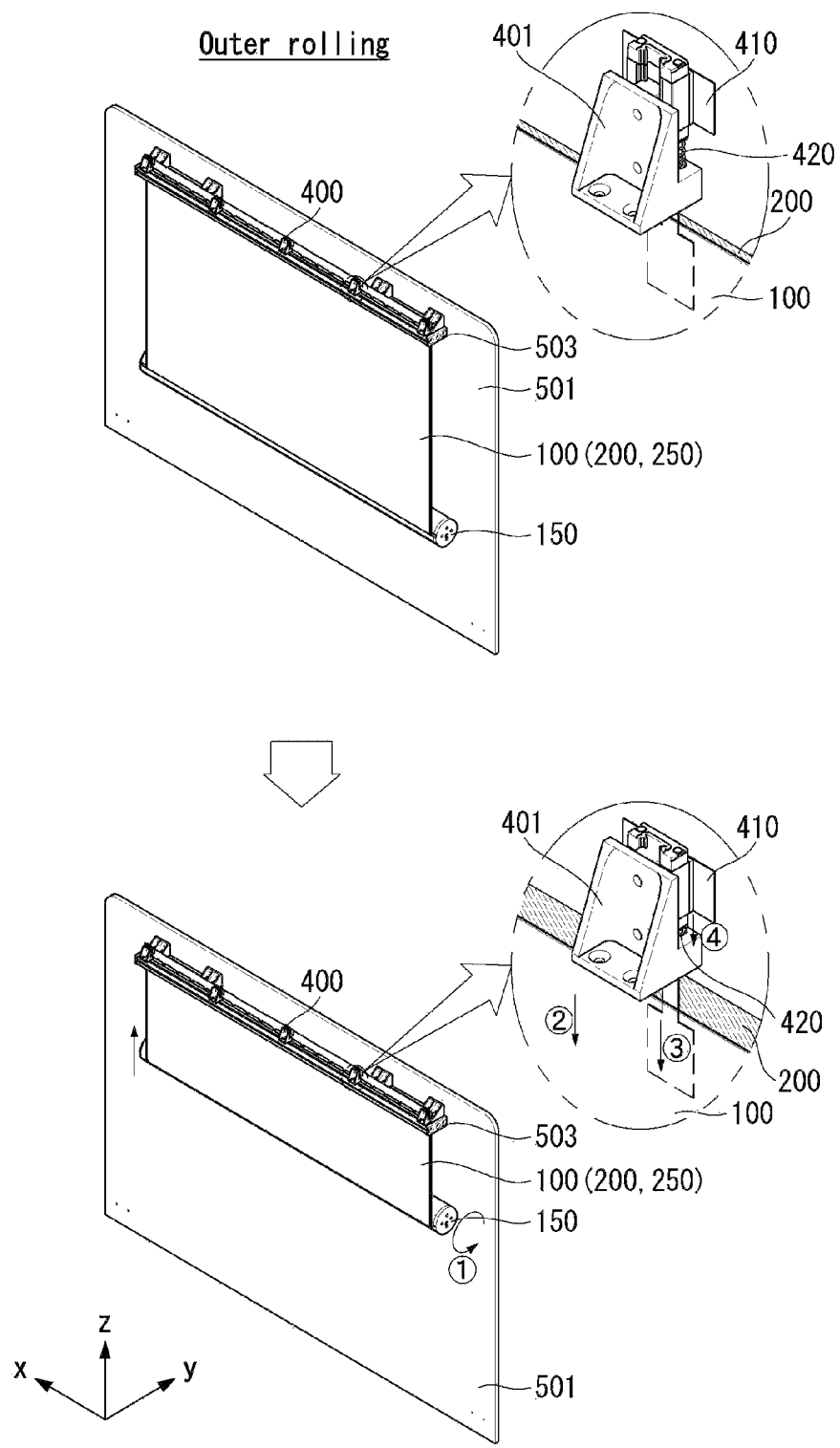
FIGS. 16 through 19 are views for explaining the operating condition of the rollable display according to the second exemplary embodiment of the present invention.
Figure 17:
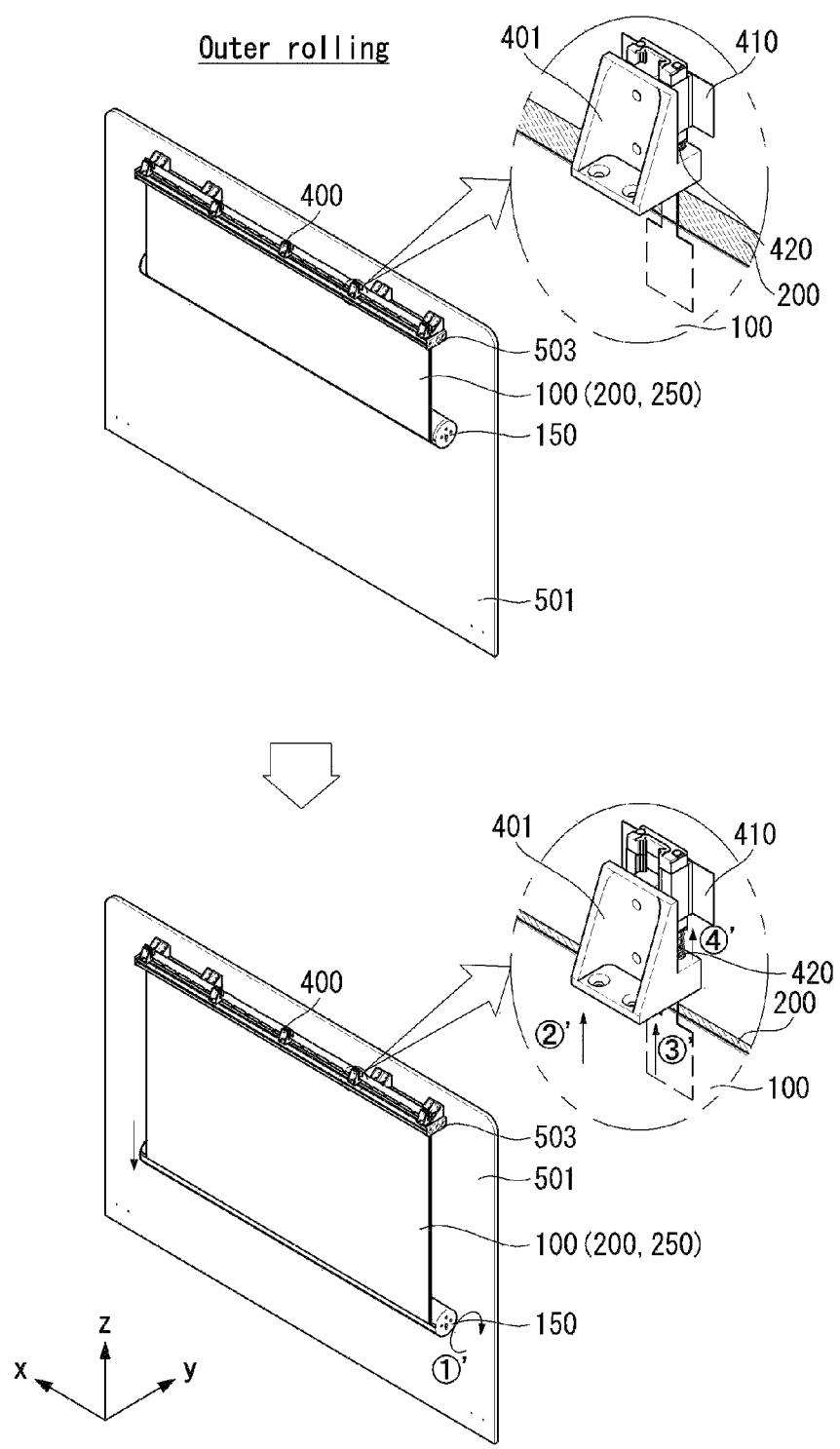
Figure 18:
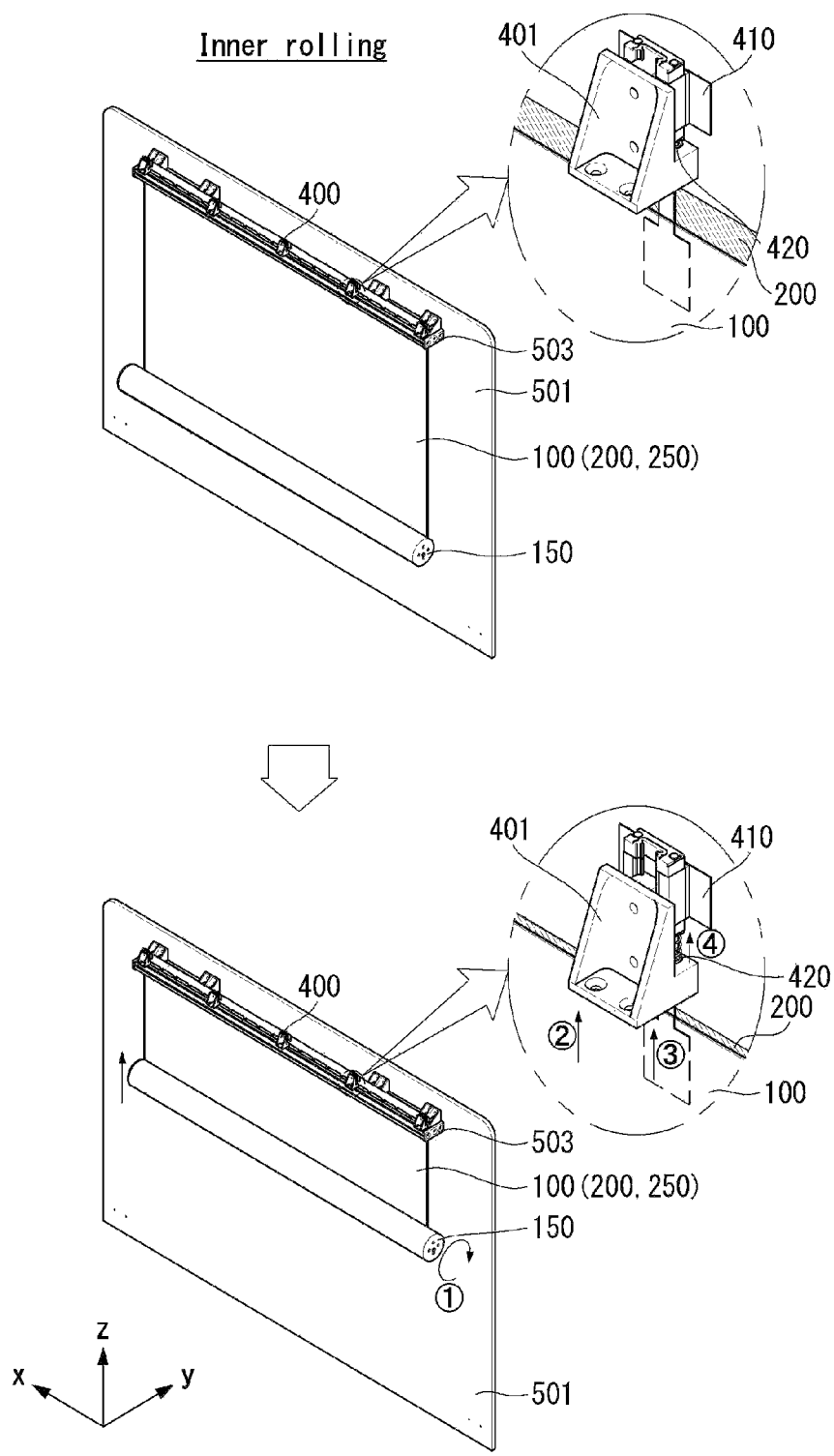
Figure 19:
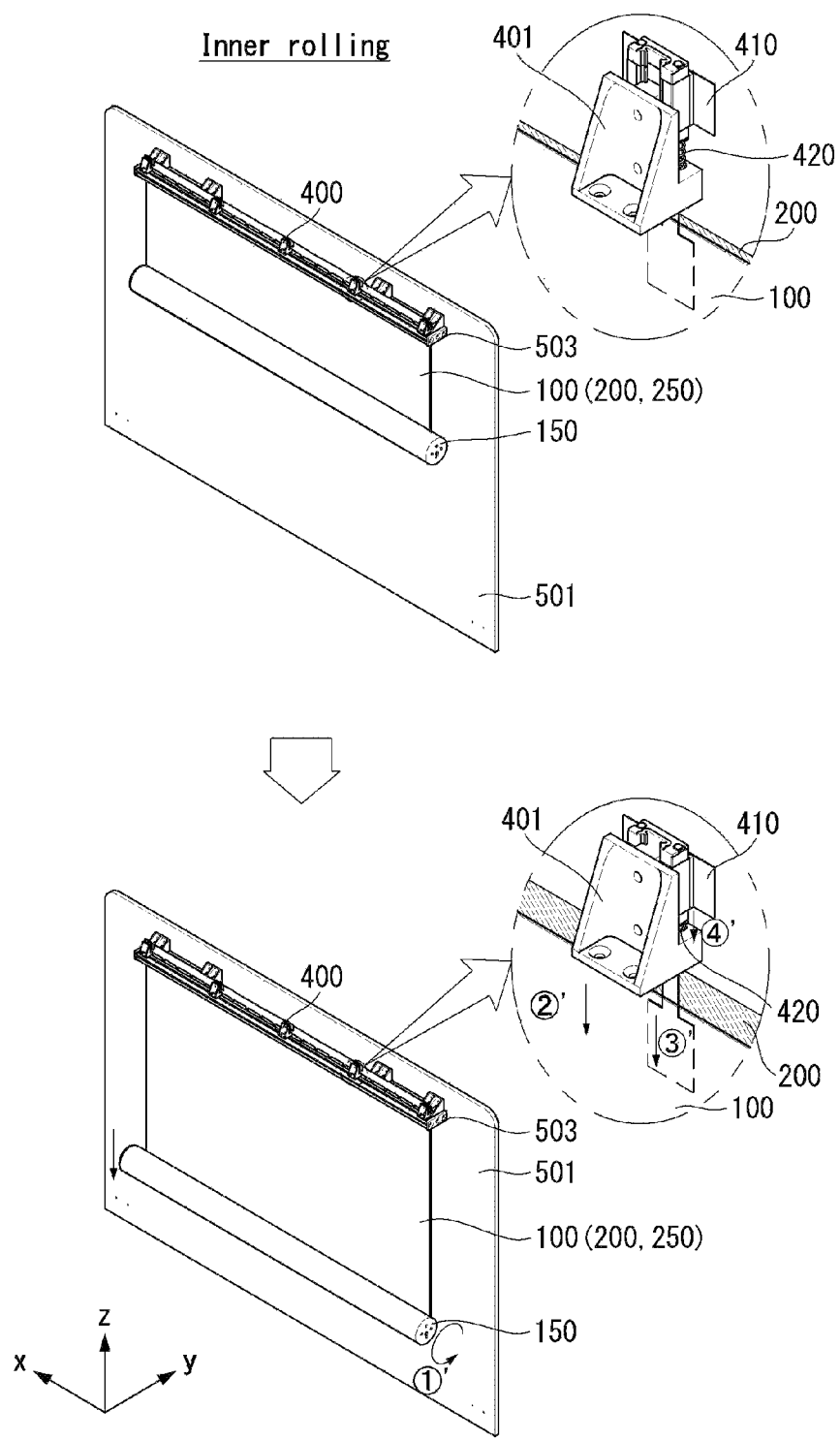

FIGS. 16 and 17 are views for explaining the operating condition of the rollable display implemented in the outer rolling manner. FIGS. 18 and 19 are views for explaining the operating condition of the rollable display implemented in the inner rolling manner.

Referring to FIGS. 16 and 17, the rollable display is configured to roll up with the outside facing in. The elastic structure 400 comprises elastic members 420, and the elastic members 420 may deform corresponding to the length deviation between the other edge of the flexible display panel 100 and the other edge of the back cover 200. The length deviation refers to how far the position of the other edge of the flexible display panel 100 and the other edge of the back cover 200 according to change of state deviates from the position of the other edge of the flexible display panel 100 and the other edge of the back cover 200 in the second state.

In an example, the elastic member 420 may be a compression spring. If the length deviation between the flexible display panel 100 and the back cover 200 increases, the compression spring may be compressed for a distance corresponding to the increase in the length of deviation. If the length deviation between the flexible display panel 100 and the back cover 200 decreases, the compression spring may regain its elasticity for a distance corresponding to the decrease in the length of deviation. That is, the elastic member 420 elastically deforms within a certain range, according to the rolling up or down of the flexible display panel 100 and the back cover 200.

Specifically, when the flexible display panel 100 and the back cover 200 roll up ①onto the panel roller 150, the flexible display panel 100 slides ② in a first direction (e.g., −Z direction) along the surface of the back cover 200, with the flexible magnet 250 in between the flexible display panel 100 and the back cover 200. As the flexible display panel 100 and the back cover 200 roll up onto the panel roller 150, the length deviation between the other edge of the flexible display panel 100 and the other edge of the back cover 200 gradually increases. The slider 410 gradually goes down ③, corresponding to the length deviation between the other edge of the flexible display panel 100 and the other edge of the back cover 200. In conjunction with this, the elastic member 420 is gradually compressed ④ (FIG. 16).

When the flexible display panel 100 and the back cover 200 roll down ①' from the panel roller 150, the flexible display panel 100 slides ②' in a second direction (e.g., +Z direction) along the surface of the back cover 200, with the flexible magnet 250 in between the flexible display panel 100 and the back cover 200. As the flexible display panel 100 and the back cover 200 roll down from the panel roller 150, the length deviation between the other edge of the flexible display panel 100 and the other edge of the back cover 200 gradually decreases. Corresponding to the decrease in the length deviation between the other edge of the flexible display panel 100 and the other edge of the back cover 200, the slider 410 gradually goes up ③', and the first elastic member 420 gradually regains its elasticity ④'. This means that the slider 410 goes up by the restoring force of the elastic member 420 and, in conjunction with this, a force pulling the flexible display panel 100 may be applied to the flexible display panel 100 (FIG. 17).

Referring to FIGS. 18 and 19, the rollable display is configured to roll up with the inside facing out. The elastic structure 400 comprises an elastic member 420, and the elastic member 420 may deform corresponding to the length deviation between the other edge of the flexible display panel 100 and the other edge of the back cover 200. In an example, the elastic member 420 may be a compression spring. If the length deviation between the flexible display panel 100 and the back cover 200 increases, the compression spring may regain its elasticity corresponding to the increase. If the length deviation between the flexible display panel 100 and the back cover 200 decreases, the compression spring may be compressed corresponding to the decrease. That is, the elastic member 420 elastically deforms within a certain range, in conjunction with the rolling up and down of the flexible display panel 100 and the back cover 200.

Specifically, when the flexible display panel 100 and the back cover 200 roll up ① onto the panel roller 150, the flexible display panel 100 slides ② in a first direction (e.g., +Z direction) along the surface of the back cover 200, with the flexible magnet 250 in between the flexible display panel 100 and the back cover 200. As the flexible display panel 100 and the back cover 200 roll up onto the panel roller 150, the length deviation between the other edge of the flexible display panel 100 and the other edge of the back cover 200 gradually increases. Corresponding to the length deviation between the other edge of the flexible display panel 100 and the other edge of the back cover 200, the slider 410 gradually goes up ③, and the elastic member 420 regains its elasticity ④. This means that the slider 410 goes up by the restoring force of the elastic member 420 and, in conjunction with this, a force pulling the flexible display panel 100 may be applied to the flexible display panel 100 (FIG. 18).

When the flexible display panel 100 and the back cover 200 roll down ①' from the panel roller 150, the flexible display panel 100 slides ② in a second direction (e.g., −Z direction) along the surface of the back cover 200, with the flexible magnet 250 in between the flexible display panel 100 and the back cover 200. As the flexible display panel 100 and the back cover 200 roll down from the panel roller 150, the length deviation between the other edge of the flexible display panel 100 and the other edge of the back cover 200 gradually decreases. The slider 410 gradually goes down ③′ corresponding to the length deviation between the other edge of the flexible display panel 100 and the other edge of the back cover 200. In conjunction with this, the first elastic member 420 is gradually compressed ④′ (FIG. 19).

By providing the elastic structure 400, the second exemplary embodiment of the present invention allows the flexible display panel 100 to slide smoothly when the flexible display panel 100 and the back cover 20 roll up or down. Accordingly, the second exemplary embodiment of the present invention can prevent the flexible display panel 100 from lifting locally off the flexible magnet 250.

<Third Exemplary Embodiment>

Figure 20:
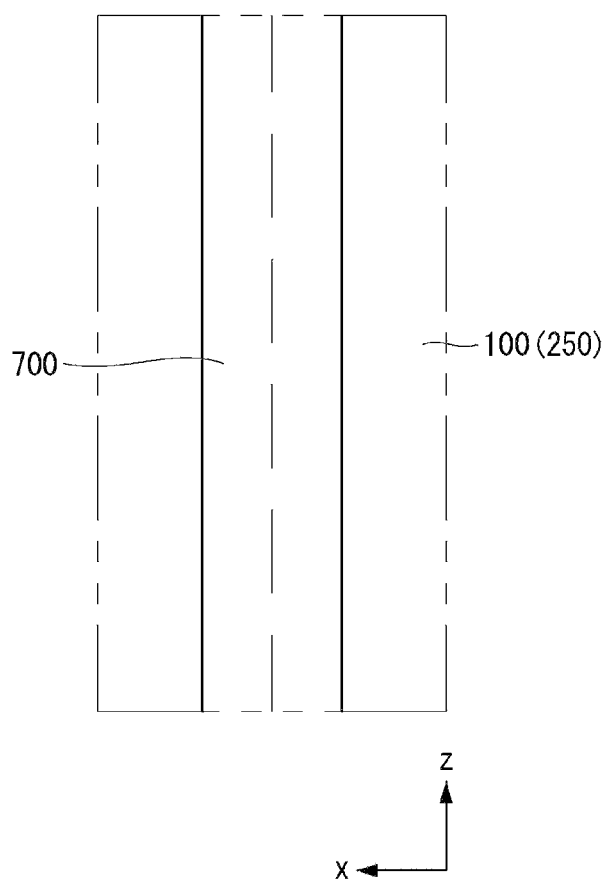
FIGS. 20 through 23C are views for explaining a rollable display according to a third exemplary embodiment of the present invention.

A rollable display according to a third exemplary embodiment of the present invention is described below with reference to FIGS. 20 through 23. FIGS. 20 through 23 are views for explaining a rollable display according to the third exemplary embodiment of the present invention. FIG. 20 and FIG. 22 are enlarged views illustrating the AR area at a side of the rollable display.

Figure 21:
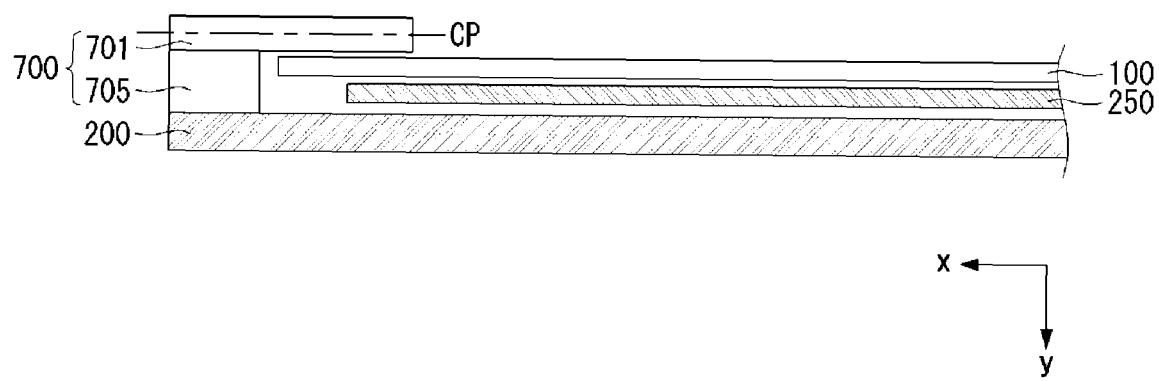
Figure 22:
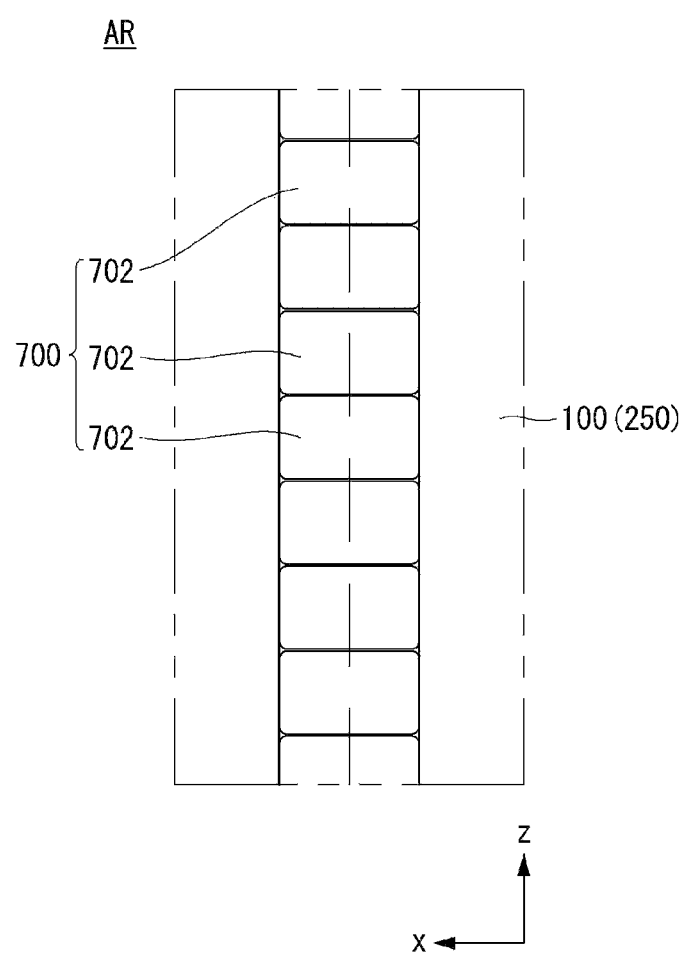

Referring to FIGS. 20 and 21, the rollable display according to the third exemplary embodiment further comprises a support structure 700. The support structure 700 is provided on a side edge of the back cover 200. The side edge extends in a direction (Z-axis) parallel to the direction in which the flexible display panel 100 and the back cover 200 roll up and down.

The side of the flexible display panel 100 is inserted into internal space provided by connecting the support structure 700 and the back cover 200 together. That is, the support structure 700 is provided in such a way that encloses the front edge of the flexible display panel 100 and the side of the flexible display panel 100. As such, the flexible display panel 100 may be kept from falling out. This means that the movement of the flexible display panel 100 is restricted to the direction in which the flexible display panel 100 rolls up or down.

The support structure 700 comprises a front body 701 and a middle body 705. The front body 701 is placed opposite the back cover 200, with the flexible display panel 100 in between them. The middle body 705 is placed between the front body 701 and the back cover 200 to fix the front body 701 to the back cover 200. The front body 701, middle body 705, and back cover 200 may be integrated as a single unit, or may be formed separately and later fastened to one another.

The front body 701, middle body 705, and back cover 200 may be made of the same material, and at least one among the front body 701, middle body 705, and back cover 200 may be made of a different material from the rest.

The front body 701 may comprise a superelastic nitinol alloy. The superelastic nitinol alloy is easy to roll along with the flexible display panel 100 because its elastic coefficient becomes smaller when the flexible display panel 100 rolls up. Also, the superelastic nitinol alloy has high restoring force because its elastic coefficient becomes larger when the flexible display panel 100 rolls down. Thus, the superelastic nitinol alloy is easy to keep flat along with the flexible display panel 100.

Referring further to FIG. 22, the support structure 700 may consist of n (n is a positive integer greater than or equal to 2) discrete segments 702. Each segment 702 may have the shape of a bar that extends in a direction (X-axis) perpendicular to the rolling direction (Z-axis). The segments 702 are arranged in the rolling direction (along the Z-axis) to protect one or both side edges of the flexible display 100. By having the support structure 700 divided into segments, the third exemplary embodiment of the present invention prevents the flexible display panel 100 from falling out and allows for smooth rolling up or down of the flexible display panel 100 without restricting it.

Figure 23A:
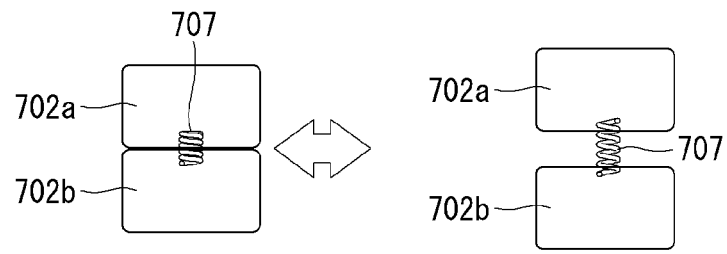

Referring further to FIG. 23A, an elastic member 707 may be provided between adjacent segments 702a and 702b in at least some part. The elastic member 707 connects the adjacent segments 702a and 702b together. For example, one end of the elastic member 707 may be connected to any one of the adjacent segments 702a and 702b, and the other end may be connected to the other adjacent segment 702a or 702b. The third elastic member 707 may move elastically corresponding to the gap between the adjacent segments 702a and 702b. The third elastic member 70 may be, but not limited to, a tension spring.

More specifically, the gap between the adjacent segments 702a and 702b becomes narrower as the flexible display panel 100 changes from the first state (i.e., rolled state) to the second state (i.e., unrolled state). That is, the gap between the adjacent segments 702a and 702b becomes wider as the flexible display panel 100 rolls up and narrower as the flexible display panel 100 rolls down.

If the flexible display panel 100 is in the second state (i.e., unrolled state), the elastic member 707 remains in the original state. This means that external force is not applied to the elastic member 707. If the flexible display panel 100 is in the first state (i.e., rolled state), the elastic member 707 elastically deforms. This means that the elastic member 707 is stretched by an applied external force. In this instance, a restoring force acts on the elastic member 707 so that it can maintain the original state. The elastic member 707 between the adjacent segments 702a and 702b assists the adjacent segments 702a and 702b to align during the unrolling operation. That is, the elastic member 707 pulls the edges of the adjacent segments 702a and 702b into alignment during the unrolling operation so that center planes CP of the elastic members 707 are placed in a common plane that is parallel to the surface of the flexible display panel 100.

In an exemplary embodiment of the present invention, if the flexible display panel 100 changes from the first state to the second state or is in the second state, the adjacent segments 702a and 702b may easily become or remain flat by connecting the adjacent segments 702a and 702b together using the third elastic member 707. This may mean that, if the flexible display panel 100 changes from the first state to the second state or is in the second state, the adjacent segments 702a and 702b can be aligned precisely.

Figure 23B:
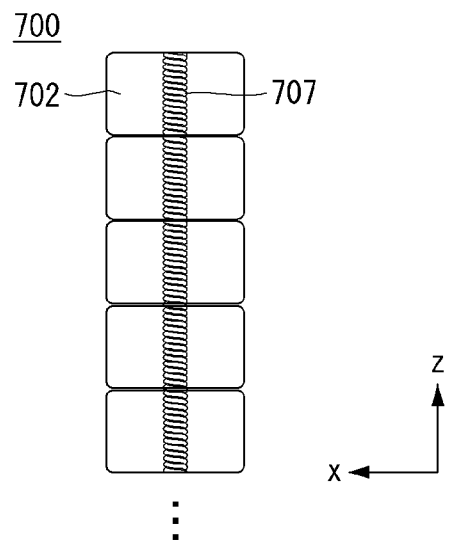
Figure 23C:
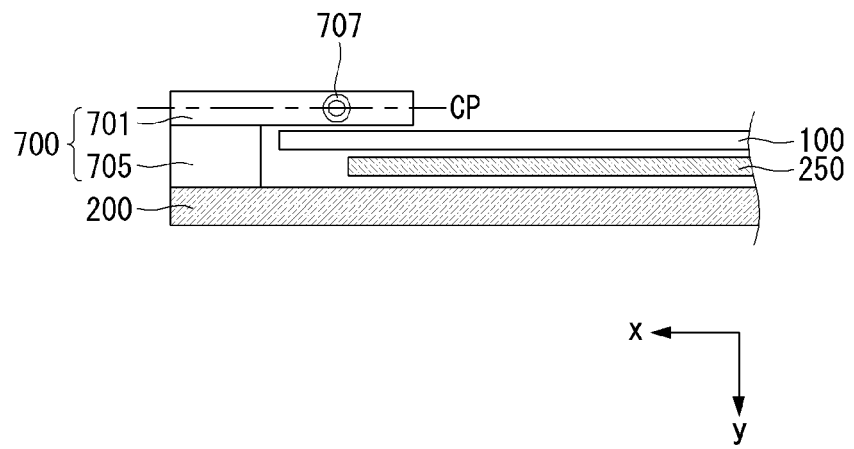

Referring further to FIGS. 23B and 23C, all the segments 702 may be connected using at least one elastic member 707. However, the present invention is not limited to this, and the elastic member 707 may be only provided between adjacent segments 702 in a certain area. Optionally, the elastic member 707 may be provided between adjacent segments 702 in multiple areas, and these areas may be spatially separated from one another.

<Fourth Exemplary Embodiment>

Figure 24A:
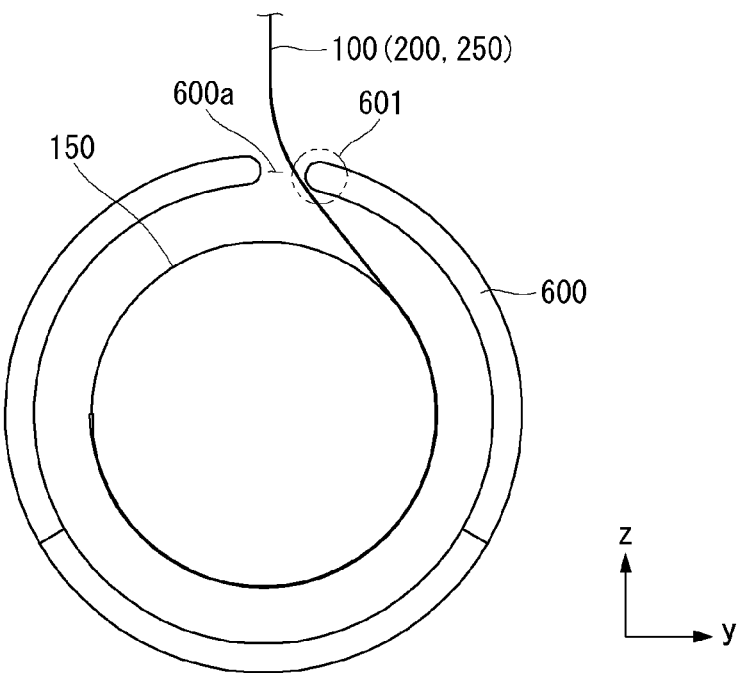
FIGS. 24A and 24B are views for explaining a rollable display according to a fourth exemplary embodiment of the present invention.
Figure 24B:
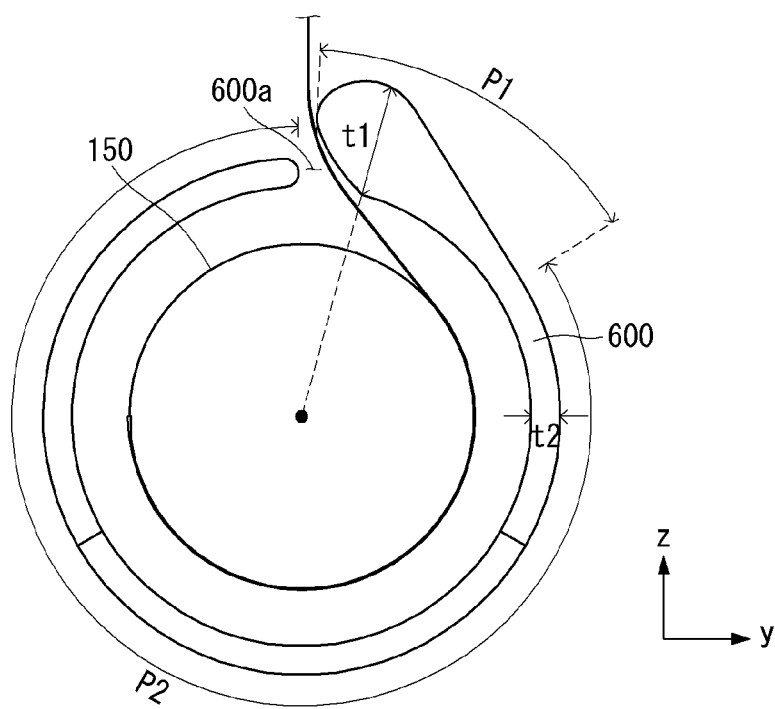

A rollable display according to a fourth exemplary embodiment of the present invention is described below with reference to FIGS. 24A and 24B. FIGS. 24A and 24B are views for explaining a rollable display according to the fourth exemplary embodiment of the present invention.

Referring to FIG. 24A, the rollable display comprises a housing 600. The housing 600 may have internal space for accommodating the panel roller 150. The internal space may further have a stationary structure (not shown) for fixing the panel roller 150.

The housing 600 further comprises a slot 600a that is open to the internal space. The slot 600a is an open part of the housing 600, and functions as an entrance through which the flexible display panel 100 is inserted or taken out. The slot 600a may have a predetermined width and length that allow the flexible display panel 100 to be easily inserted or taken out.

The housing 600 may be cylindrical and have a circular cross-section. However, the housing 600 is not limited to this shape, and may take any shape as long as its internal space is sufficient to accommodate a structure such as the panel roller 150.

The flexible display panel 150, when rolled up onto or rolled down from the panel roller 150, comes out or goes in through the slot 600a. In this case, the flexible display panel 100 may be damaged by collision or friction with at least part of the cut surfaces defining the slot 600a.

In the fourth exemplary embodiment of the present invention, among the cut surfaces defining the slot 600a, the cut surface 601 that makes contact with the flexible display panel 100 while the flexible display panel 100 is rolled or unrolled has a predetermined curvature ratio. Accordingly, the fourth exemplary embodiment of the present invention offers the advantage of preventing damage to the flexible display panel 100 caused by friction or collision between the flexible display panel 100 and the cut surface 601 of the housing 600 when the flexible display panel 100 is inserted or taken out.

The housing 600 of FIG. 24B has a locally rigid structure. That is, the fourth exemplary embodiment of the present invention prevents defects such as breaking, bending, or twisting of the housing 600, which is fragile to an external force applied to it, by making at least some part of the housing 600 thicker than other parts. The external force applied to some part of the housing 600 may be a compressing, bending, or twisting force applied to the housing 600 as the flexible display panel 100 makes contact with the housing 600 when the flexible display panel 100 is inserted or taken out.

The housing 600 comprises a first portion P1 and a second portion P2 that are of different radial thicknesses. The first portion P1 is an area which is adjacent to the cut surface 601 making contact with the flexible display panel 100, among the cut surfaces defining the slot 600a. The first portion P1 is an area which is fragile to an external force applied from the flexible display panel 100 when the flexible display panel 100 is inserted or taken out. The second portion P2 is an area which is not fragile to an external force from the flexible display panel 100.

The locally rigid structure may be implemented by making the radial thickness t1 of the first portion P1 larger than the radial thickness t2 of the second portion P2. With this locally rigid structure, the fourth exemplary embodiment of the present invention prevents defects such as breaking, bending, or twisting of the housing 600 due to a compressing, bending, or twisting force applied from the flexible display panel 100.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A rollable display comprising:
a flexible display panel rolled up or down;
a back cover that rolls up or down along with the flexible display panel, the back cover having an edge fixed to an edge of the flexible display panel;
a flexible magnet fixed to either the flexible display panel or the back cover, and interposed between the flexible display panel and the back cover; and
an elastic member having one end connected to another edge of the flexible display panel opposite the edge to which the edge of back cover is fixed, and another end connected to another edge of the back cover,
wherein a length of elastic deformation of the elastic member corresponds to a length deviation between the other edge of the flexible display panel and the other edge of the back cover when the flexible display panel and the back cover are rolled up or down.

2. The rollable display of claim 1, further comprising a weighting bar fixed to the other edge of the back cover, wherein the other end of the elastic member is connected to the weighting bar.

3. The rollable display of claim 1, further comprising an auxiliary bar fixed to the other edge of the flexible display panel, wherein one end of the elastic member is connected to the auxiliary bar.

4. A rollable display comprising:
a flexible display panel rolled up or down;
a back cover that rolls up or down along with the flexible display panel, the back cover having an edge fixed to an edge of the flexible display panel;
a flexible magnet fixed to either the flexible display panel or the back cover, and interposed between the flexible display panel and the back cover;
a panel roller fixed to the edge of the flexible display panel and the edge of the back cover, the flexible display panel and the back cover rolling up onto or rolling down from the panel roller; and
an elastic structure connected to the other edge of the flexible display panel, wherein the elastic structure comprises:
a stationary base member fixed at a specified location,
a slider slidably fastened to the stationary base member, an end of the slider fixed to another edge of the flexible display panel opposite the edge to which the end of back cover is fixed, the slider placed between the flexible display panel and the back cover, and
an elastic member that elastically deforms along a sliding direction of the slider, with one end connected to the stationary base member and another end connected to the slider, the elastic member elastically deforms for a length corresponding to a length deviation between the other edge of the flexible display panel and the other edge of the back cover when the flexible display panel and the back cover are roll up or down.

5. The rollable display of claim 1, further comprising a support structure attached to and extending along a side edge of the back cover, and the support structure enclosing a front edge of the flexible display panel and a side of the flexible display panel, wherein the support structure comprises a plurality of segments arranged in a direction parallel to the direction in which the flexible display panel and the back cover are rolled up or down.

6. The rollable display of claim 5, further comprising a support structure attached to and extending along a side edge of the back cover, the support structure comprises:
a front body placed opposite the back cover, with the flexible display panel placed between the front body and the back cover, wherein the front body comprises a superelastic nitinol alloy; and
a middle body placed between the front body and the back cover.

7. The rollable display of claim 5, further comprising an elastic member connecting adjacent segments.

8. The rollable display of claim 1, further comprising:
a panel roller which the flexible display panel and the back cover roll up onto and roll down from; and
a housing accommodating the panel roller and comprising a slot open to internal space and through which the flexible display panel and the back cover are rolled up or down,
wherein a cut surface that defines the slot and makes contact with the flexible display panel when the flexible display panel is rolls up or down has a predetermined curvature ratio.

9. The rollable display of claim 1, further comprising:
a panel roller which the flexible display panel and the back cover roll up onto and roll down from; and
a housing accommodating the panel roller, and comprising a slot that is open to internal space and through which the flexible display panel and the back cover are roll up or down, the housing comprising a first portion and a second portion that are of different thicknesses, and the first portion is adjacent to a cut surface defining the slot and making contact with the flexible display panel, the cut surface thicker than the second portion.

10. The rollable display of claim 1, wherein the flexible magnet is divided into multiple pieces, and at least one of (i) a gap between adjacent flexible magnet pieces, (ii) magnetic strength of the flexible magnet pieces, and (iii) density of the flexible magnet pieces varying according to locations.

11. A rollable display comprising:
a flexible display panel;
a back cover covering a rear side of the flexible display panel, the back cover rolled or unrolled with the flexible display panel;
a flexible magnet between the flexible display panel and the back cover, the flexible magnet fixed to the flexible display panel or the back cover and rolled or unrolled with the flexible display panel, the flexible magnet sliding relative to the back cover or the flexible display panel as the flexible display panel is rolled or unrolled;
a panel roller configured to secure an end of the flexible display panel and an end of the back cover, the panel roller configured to wind or unwind the flexible display panel, the back cover and the flexible magnet by rotating; and
an elastic member coupled between the back cover and the flexible display panel to pull another end of the flexible display panel toward another end of the back cover as the flexible magnet is wound onto the panel roller or the flexible magnet is unwound from the panel roller.

12. The rollable display of claim 11, further comprising an auxiliary bar extending across the other end of the flexible display panel and more rigid than the flexible display panel, an end of the elastic member connected to the auxiliary bar and another end of the elastic member coupled to the back cover.

13. The rollable display of claim 11, further comprising a weighting bar fixed to the other edge of the back cover to pull the flexible display panel downwards.

14. A rollable display comprising:
a flexible display panel;
a back cover covering a rear side of the flexible display panel, the back cover rolled or unrolled with the flexible display panel;
a flexible magnet between the flexible display panel and the back cover, the flexible magnet fixed to the flexible display panel or the back cover and rolled or unrolled with the flexible display panel, the flexible magnet sliding relative to the back cover or the flexible display panel as the flexible display panel is rolled or unrolled;
a panel roller configured to secure an end of the flexible display panel and an end of the back cover, the panel roller configured to wind or unwind the flexible display panel, the back cover and the flexible magnet by rotating; and
an elastic structure connected to the other edge of the flexible display panel, wherein the elastic structure comprises:
a base;
a slider configured to move relative to the base, the slider attached to another end of the flexible display panel; and
an elastic member between the base and the slider to pull the flexible display panel away from the panel roller as the flexible display panel is wound or unwound from the panel roller.

15. The rollable display device of claim 14, wherein the base is configured to fix to a stationary body and the panel roller unrolls with the other end of the flexible display panel supported by the slider and the elastic member.

16. The rollable display device of claim 14, wherein the base comprises at least one guide groove engaging with a guide boss of the slider to slidably move the slider relative to the base.

17. The rollable display device of claim 16, wherein the base further comprises an insertion groove configured to receive the elastic member, the slider comprising a protrusion configured to be received in the elastic member and inserted into the insertion groove.

18. The rollable display device of claim 11, further comprising a support structure attached along a side edge of the back cover, the support structure comprising a front body spaced apart from the back cover, a side edge of the flexible display panel accommodated in space between the front body and the back cover.

19. The rollable display device of claim 18, wherein the support structure comprises a plurality of segments that are aligned so that center planes of the plurality of segments are placed in a common plane that is parallel to the flexible display panel.

20. The rollable display device of claim 11, wherein the panel roller is enclosed in a housing with a slot through which the flexible display panel, the flexible magnet and the back cover pass through.

21. The rollable display device of claim 20, wherein the slot is defined at least by a cut surface coming in touch with the flexible display panel or the back cover, wherein a radial thickness of a portion of the housing forming the cut surface is greater than other portions of the housing.

* * * * *